United States Patent
Dean et al.

(10) Patent No.: US 9,606,588 B2
(45) Date of Patent: Mar. 28, 2017

(54) CLOSED-LOOP COOLING SYSTEM FOR HIGH-DENSITY CLUSTERED COMPUTER SYSTEM

(71) Applicant: Sillicon Graphics International Corp., Fremont, CA (US)

(72) Inventors: Steven J. Dean, Chippewa Falls, WI (US); David R. Collins, Eau Claire, WI (US); Timothy Scott McCann, Eleva, WI (US); Perry D. Franz, Elk Mound, WI (US); Jeffrey M. Glanzman, Mondovi, WI (US)

(73) Assignee: Silicon Graphics International Corp., Milpitas, CA (US)

( * ) Notice: Subject to any disclaimer, the term of this patent is extended or adjusted under 35 U.S.C. 154(b) by 95 days.

(21) Appl. No.: 13/931,754

(22) Filed: Jun. 28, 2013

(65) Prior Publication Data
US 2014/0124168 A1    May 8, 2014

Related U.S. Application Data

(60) Provisional application No. 61/724,274, filed on Nov. 8, 2012.

(51) Int. Cl.
*G11B 33/02* (2006.01)
*H05K 7/00* (2006.01)
(Continued)

(52) U.S. Cl.
CPC ........... *G06F 1/20* (2013.01); *G06F 1/181* (2013.01); *H05K 7/20754* (2013.01); *H05K 7/20827* (2013.01); *G06F 2200/201* (2013.01)

(58) Field of Classification Search
CPC ..................... H05K 7/20745; G06F 1/206
(Continued)

(56) References Cited

U.S. PATENT DOCUMENTS

| 4,884,167 A | 11/1989 | Mine |
| 4,884,168 A | 11/1989 | August et al. |

(Continued)

FOREIGN PATENT DOCUMENTS

| TW | M413895 | 10/2011 |
| WO | WO 2008/070175 A2 | 6/2008 |
| WO | 2012118554 A1 | 9/2012 |

OTHER PUBLICATIONS

Woodacre, M. "Capability system with interconnect for global addressability and hardware collectives," 15th Workshop on High Performance Computing in Meterology, Session 10, Oct. 3, 2012, pp. 5-7(online), (retrieved on Feb. 17, 2014), http://www.ecmwf.int/newsevents/meetings/workshops/2012/high_performance_computing_15th/Presentations/.

(Continued)

*Primary Examiner* — Jerry Wu
(74) *Attorney, Agent, or Firm* — Sunstein Kann Murphy & Timbers LLP

(57) ABSTRACT

A cooling system for a high performance computing system includes a closed-loop cooling cell having two compute racks and a cooling tower between the compute racks. Each compute rack includes at least one blade enclosure, and the cooling tower includes at least one water-cooled heat exchanger and one or more blowers configured to draw warm air from a side of the compute racks towards a back, across the water-cooled heat exchanger, and to circulate cooled air to a side of the compute racks towards a front. The cooling cell further includes a housing enclosing the compute racks and the cooling tower to provide a closed-loop air flow within the cooling cell. The cooling system further includes cooling plate(s) configured to be disposed between two computing boards within the computing blade, and a (Continued)

fluid connection coupled to the cooling plate and in fluid communication with the blade enclosure.

18 Claims, 21 Drawing Sheets

(51) Int. Cl.
*H05K 5/00* (2006.01)
*G06F 1/20* (2006.01)
*H05K 7/20* (2006.01)
*G06F 1/18* (2006.01)

(58) Field of Classification Search
USPC ....... 361/679.46–679.54, 688–747; 181/198; 312/236
See application file for complete search history.

(56) References Cited

U.S. PATENT DOCUMENTS

| | | | |
|---|---|---|---|
| 5,810,501 A | 9/1998 | Ross | |
| 5,892,658 A | 4/1999 | Urda et al. | 361/704 |
| 6,064,575 A | 5/2000 | Urda et al. | |
| 6,071,143 A | 6/2000 | Barthel et al. | 439/377 |
| 7,318,322 B2 | 1/2008 | Ota et al. | |
| 7,564,685 B2 | 7/2009 | Clidaras et al. | |
| 7,589,974 B2 | 9/2009 | Grady et al. | |
| 7,907,406 B1* | 3/2011 | Campbell et al. | 361/699 |
| 8,027,162 B2 | 9/2011 | Campbell et al. | |
| 2002/0124114 A1 | 9/2002 | Bottom et al. | |
| 2007/0002536 A1 | 1/2007 | Hall et al. | 361/695 |
| 2008/0080149 A1 | 4/2008 | Hanna et al. | 361/752 |
| 2008/0094797 A1* | 4/2008 | Coglitore et al. | 361/687 |
| 2008/0158818 A1* | 7/2008 | Clidaras et al. | 361/699 |
| 2009/0086432 A1 | 4/2009 | Campbell et al. | 361/696 |
| 2010/0254089 A1 | 10/2010 | Anderl et al. | |
| 2011/0007473 A1 | 1/2011 | Franz et al. | 361/679.33 |
| 2011/0013348 A1 | 1/2011 | Seibold et al. | |
| 2011/0255230 A1 | 10/2011 | Mori | |
| 2012/0120603 A1 | 5/2012 | Campbell et al. | 361/698 |
| 2012/0140403 A1 | 6/2012 | Lau et al. | 361/679.47 |
| 2012/0147553 A1 | 6/2012 | Eriksen | |
| 2012/0293947 A1 | 11/2012 | Chen et al. | |

OTHER PUBLICATIONS

International Searching Authority—International Search Report—International Application No. PCT/US2013/061469 dated Mar. 6, 2014, together with the Written Opinion of the International Searching Authority, 16 pages.

European Patent Office, Extended European Search Report—Application No. EP 13 85 2972, dated Jun. 6, 2016, 9 pages.

European Patent Office, Supplementary Partial European Search Report—Application No. EP 13 85 3840, dated May 18, 2016, 6 pages.

* cited by examiner

Rear View of D-Rack

CLOSED-LOOP COOLING SYSTEM FOR HIGH-DENSITY CLUSTERED COMPUTER SYSTEM

CROSS REFERENCE TO RELATED APPLICATIONS

The present application claims priority to U.S. Provisional Patent Application No. 61/724,274 filed Nov. 8, 2012, the disclosure of which is incorporated by reference herein in its entirety.

The present application is related to U.S. patent application Ser. No. 13/931,730 entitled ON-BLADE COLD SINK FOR HIGH-DENSITY CLUSTERED COMPUTER SYSTEM, filed on Jun. 28, 2013, and U.S. patent application Ser. No. 13/931,748 entitled TWIN SERVER BLADES FOR HIGH-DENSITY CLUSTERED COMPUTER SYSTEM, filed on Jun. 28, 2013, the disclosures of which are incorporated by reference herein in their entirety.

TECHNICAL FIELD

The invention generally relates to a cooling configuration used in a multi-node computer system and, more particularly, the invention relates to providing a closed-loop cooling cell for a high-density clustered computer system.

BACKGROUND ART

As high performance computing ("HPC") systems have gotten more powerful, the challenges associated with keeping these more powerful components cool have become increasingly difficult. In addition, physical constraints are driving many aspects of the high-density clustered computer configuration, which make effective and efficient cooling of the system even more demanding and an essential part of large-scale HPC installations. Standard compute rack and cooling configurations are often unable to adequately provide the scale and density requirements needed for high-density clusters. Thus, new cooling designs are needed to accommodate these demanding high-density clustered computer installations.

SUMMARY OF VARIOUS EMBODIMENTS

Various embodiments of the present invention provide a highly-efficient, cooling system with a closed-loop cooling cell configuration for use with a high performance computing ("HPC") system. The closed-loop cooling cell includes two compute racks and a cooling tower between the compute racks. Each compute rack includes at least one blade enclosure. The cooling tower includes one or more water-cooled heat exchangers and one or more blowers configured to draw warm air from the side of the compute racks towards the back, across the water-cooled heat exchanger, and to circulate cooled air to the side of the compute racks towards the front. The cooling cell further includes a housing enclosing the compute racks and the cooling tower to provide a closed-loop air flow within the cooling cell. The cooling system further includes one or more cooling plates with each cooling plate configured to be disposed between two computing boards within the computing blade, and a fluid connection coupled to the cooling plate and in fluid communication with the blade enclosure.

In related embodiments, the cooling system includes two closed-loop cooling cells that are positioned back-to-back and the housing encloses both closed-loop cooling cells to provide two closed-loop air flows within the cooling system. In both the single cooling cell and double cooling cell configuration, the compute racks may also have a cooling manifold that couples to computing blades in the blade enclosures, and the cooling system may further have an external cooling distribution unit with fluid connections connecting to the cooling manifolds. The external cooling distribution unit may further include a liquid-cooled heat exchanger in contact with a portion of the fluid connections and one or more pumps that move liquid within the fluid connections from the cooling manifolds to the liquid-cooled heat exchanger. The cooling cell may include two water-cooled heat exchangers positioned in a v-shape. The compute racks may be in an M-rack configuration or D-rack configuration.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a cooling system for a high performance computing ("HPC") system includes a closed-loop cooling cell configuration that has a cooling tower between two compute racks in a self-contained environment, so that the cooling cell does not exhaust heated air into the computer room. In addition to the air-cooling, the system further provides cooling at the blade level with one or more cooling plates within the blade. The cooling cell is a sealed unit that is sealed on all sides and the top and bottom to substantially prevent warm air from escaping into the computer room, adding to the heat load in the computer room. Two cooling cells may be arranged back-to-back to provide two closed-loop air flows within the cooling system. The cooling towers draw hot air across water-cooled heat exchangers and recirculate the cooled air to cool the compute blades within the compute rack. This approach provides greater efficiency over rack-level cooling, decreasing power costs associated with cooling, and utilizing a single water source. In addition, the closed-loop airflow arrangement has the benefit of reducing acoustic emissions, relative to open-loop systems, since larger blowers may be used that run at lower RPMs and make less noise than small diameter fans. Additional cooling may be provided to the blades with a cooling distribution unit that is external to the cooling cell. Details of illustrative embodiments are discussed below.

System Architecture

Figure 1:
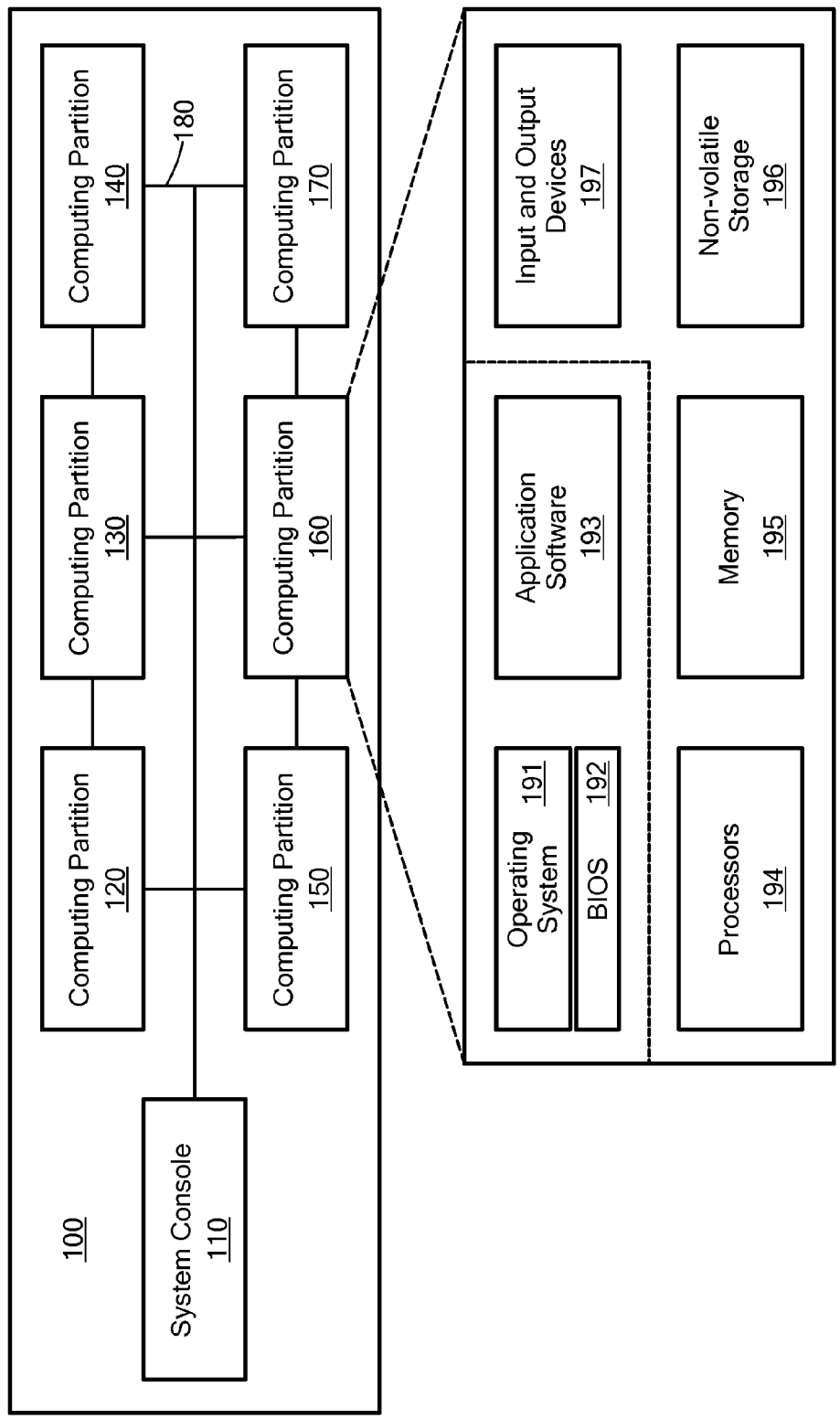
FIG. 1 schematically shows a logical view of an exemplary HPC system used with embodiments of the present invention.

FIG. 1 schematically shows a logical view of an exemplary high-performance computing system 100 that may be used with illustrative embodiments of the present invention. Specifically, as known by those in the art, a "high-performance computing system," or "HPC system," is a computing system having a plurality of modular computing resources that are tightly coupled using hardware interconnects, so that processors may access remote data directly using a common memory address space.

The HPC system 100 includes a number of logical computing partitions 120, 130, 140, 150, 160, 170 for providing computational resources, and a system console 110 for managing the plurality of partitions 120-170. A "computing partition" (or "partition") in an HPC system is an administrative allocation of computational resources that runs a single operating system instance and has a common memory address space. Partitions 120-170 may communicate with the system console 110 using a logical communication network 180. A system user, such as a scientist, engineer, or technician, who desires to perform a calculation, may request computational resources from a system operator, who uses the system console 110 to allocate and manage those resources. Allocation of computational resources to partitions is described below. The HPC system 100 may have any number of computing partitions that are administratively assigned as described in more detail below, and often has only one partition that encompasses all of the available computing resources. Accordingly, this figure should not be seen as limiting the scope of embodiments of the present invention.

Each computing partition, such as partition 160, may be viewed logically as if it were a single computing device, akin to a desktop computer. Thus, the partition 160 may execute software, including a single operating system ("OS") instance 191 that uses a basic input/output system ("BIOS") 192 as these are used together in the art, and application software 193 for one or more system users.

Accordingly, as also shown in FIG. 1, a computing partition may have various hardware allocated to it by a system operator, including one or more processors 194, volatile memory 195, non-volatile storage 196, and input and output ("I/O") devices 197 (e.g., network cards, video display devices, keyboards, and the like). However, in HPC systems like the embodiment in FIG. 1, each computing partition has a great deal more processing power and memory than a typical desktop computer. The OS software may include, for example, a Windows® operating system by Microsoft Corporation of Redmond, Wash., or a Linux operating system. Moreover, although the BIOS may be provided as firmware by a hardware manufacturer, such as Intel Corporation of Santa Clara, Calif., it is typically customized according to the needs of the HPC system designer to support high-performance computing, as described below in more detail.

As part of its system management role, the system console 110 acts as an interface between the computing capabilities of the computing partitions 120-170 and the system operator or other computing systems. To that end, the system console 110 issues commands to the HPC system hardware and software on behalf of the system operator that permit, among other things: 1) booting the hardware, 2) dividing the system computing resources into computing partitions, 3) initializing the partitions, 4) monitoring the health of each partition and any hardware or software errors generated therein, 5) distributing operating systems and application software to the various partitions, 6) causing the operating systems and software to execute, 7) backing up the state of the partition or software therein, 8) shutting down application software, and 9) shutting down a computing partition or the entire HPC system 100. These particular functions are described in more detail in the section below entitled "System Operation."

Figure 2:
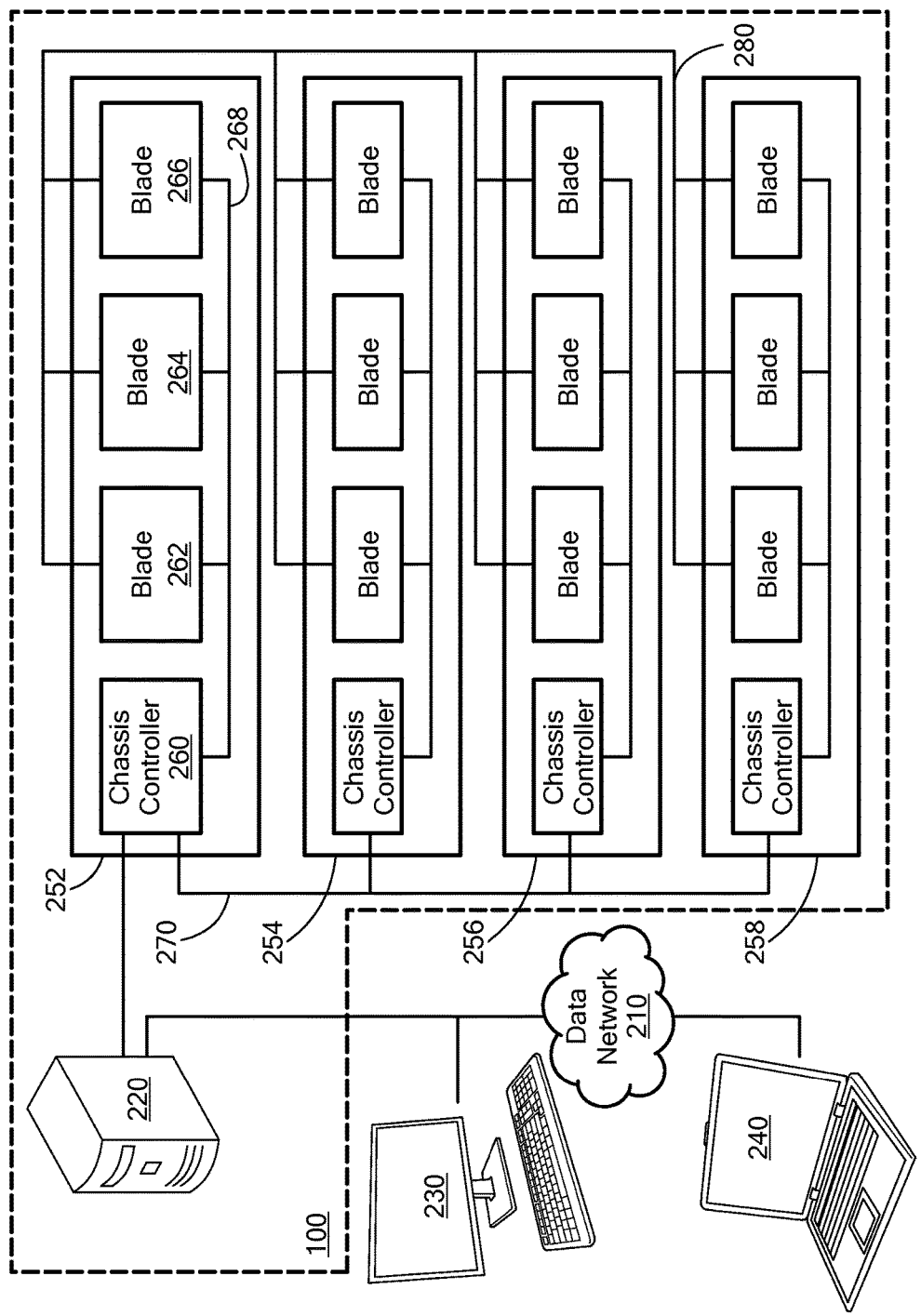
FIG. 2 schematically shows a physical view of the HPC system of FIG. 1.

FIG. 2 schematically shows a physical view of a high performance computing system 100 in accordance with the embodiment of FIG. 1. The hardware that comprises the HPC system 100 of FIG. 1 is surrounded by the dashed line. The HPC system 100 is connected to an enterprise data network 210 to facilitate user access.

The HPC system 100 includes a system management node ("SMN") 220 that performs the functions of the system console 110. The management node 220 may be implemented as a desktop computer, a server computer, or other similar computing device, provided either by the enterprise or the HPC system designer, and includes software necessary to control the HPC system 100 (i.e., the system console software).

The HPC system 100 is accessible using the data network 210, which may include any data network known in the art, such as an enterprise local area network ("LAN"), a virtual private network ("VPN"), the Internet, or the like, or a combination of these networks. Any of these networks may permit a number of users to access the HPC system resources remotely and/or simultaneously. For example, the management node 220 may be accessed by an enterprise computer 230 by way of remote login using tools known in the art such as Windows® Remote Desktop Services or the Unix secure shell. If the enterprise is so inclined, access to the HPC system 100 may be provided to a remote computer 240. The remote computer 240 may access the HPC system by way of a login to the management node 220 as just described, or using a gateway or proxy system as is known to persons in the art.

The hardware computing resources of the HPC system 100 (e.g., the processors, memory, non-volatile storage, and I/O devices shown in FIG. 1) are provided collectively by one or more "blade chassis," such as blade chassis 252, 254, 256, 258 shown in FIG. 2, that are managed and allocated into computing partitions. A blade chassis is an electronic chassis that is configured to house, power, and provide high-speed data communications between a plurality of stackable, modular electronic circuit boards called "blades." Each blade includes enough computing hardware to act as a standalone computing server. The modular design of a blade chassis permits the blades to be connected to power and data lines with a minimum of cabling and vertical space.

Accordingly, each blade chassis, for example blade chassis 252, has a chassis management controller 260 (also referred to as a "chassis controller" or "CMC") for managing system functions in the blade chassis 252, and a number of blades 262, 264, 266 for providing computing resources. Each blade, for example blade 262, contributes its hardware computing resources to the collective total resources of the HPC system 100. The system management node 220 manages the hardware computing resources of the entire HPC system 100 using the chassis controllers, such as chassis controller 260, while each chassis controller in turn manages the resources for just the blades in its blade chassis. The chassis controller 260 is physically and electrically coupled to the blades 262-266 inside the blade chassis 252 by means of a local management bus 268, described below in more detail. The hardware in the other blade chassis 254-258 is similarly configured.

The chassis controllers communicate with each other using a management connection 270. The management connection 270 may be a high-speed LAN, for example, running an Ethernet communication protocol, or other data bus. By contrast, the blades communicate with each other using a computing connection 280. To that end, the computing connection 280 illustratively has a high-bandwidth, low-latency system interconnect, such as NumaLink, developed by Silicon Graphics International Corp. of Fremont, Calif.

The chassis controller 260 provides system hardware management functions to the rest of the HPC system. For example, the chassis controller 260 may receive a system boot command from the SMN 220, and respond by issuing boot commands to each of the blades 262-266 using the local management bus 268. Similarly, the chassis controller 260 may receive hardware error data from one or more of the blades 262-266 and store this information for later analysis in combination with error data stored by the other chassis controllers. In some embodiments, such as that shown in FIG. 2, the SMN 220 or an enterprise computer 230 are provided access to a single, master chassis controller 260 that processes system management commands to control the HPC system 100 and forwards these commands to the other chassis controllers. In other embodiments, however, an SMN 220 is coupled directly to the management connection 270 and issues commands to each chassis controller individually. Persons having ordinary skill in the art may contemplate variations of these designs that permit the same type of functionality, but for clarity only these designs are presented herein.

The blade chassis 252, its blades 262-266, and the local management bus 268 may be provided as known in the art. However, the chassis controller 260 may be implemented using hardware, firmware, or software provided by the HPC system designer. Each blade provides the HPC system 100 with some quantity of processors, volatile memory, non-volatile storage, and I/O devices that are known in the art of standalone computer servers. However, each blade also has hardware, firmware, and/or software to allow these computing resources to be grouped together and treated collectively as computing partitions, as described below in more detail in the section entitled "System Operation."

While FIG. 2 shows an HPC system 100 having four chassis and three blades in each chassis, it should be appreciated that any combination of chassis and blades may be used and these figures do not limit the scope of embodiments of the present invention. For example, an HPC system may have dozens of chassis and hundreds of blades; indeed, HPC systems often are desired because they provide very large quantities of tightly-coupled computing resources.

Figure 3:
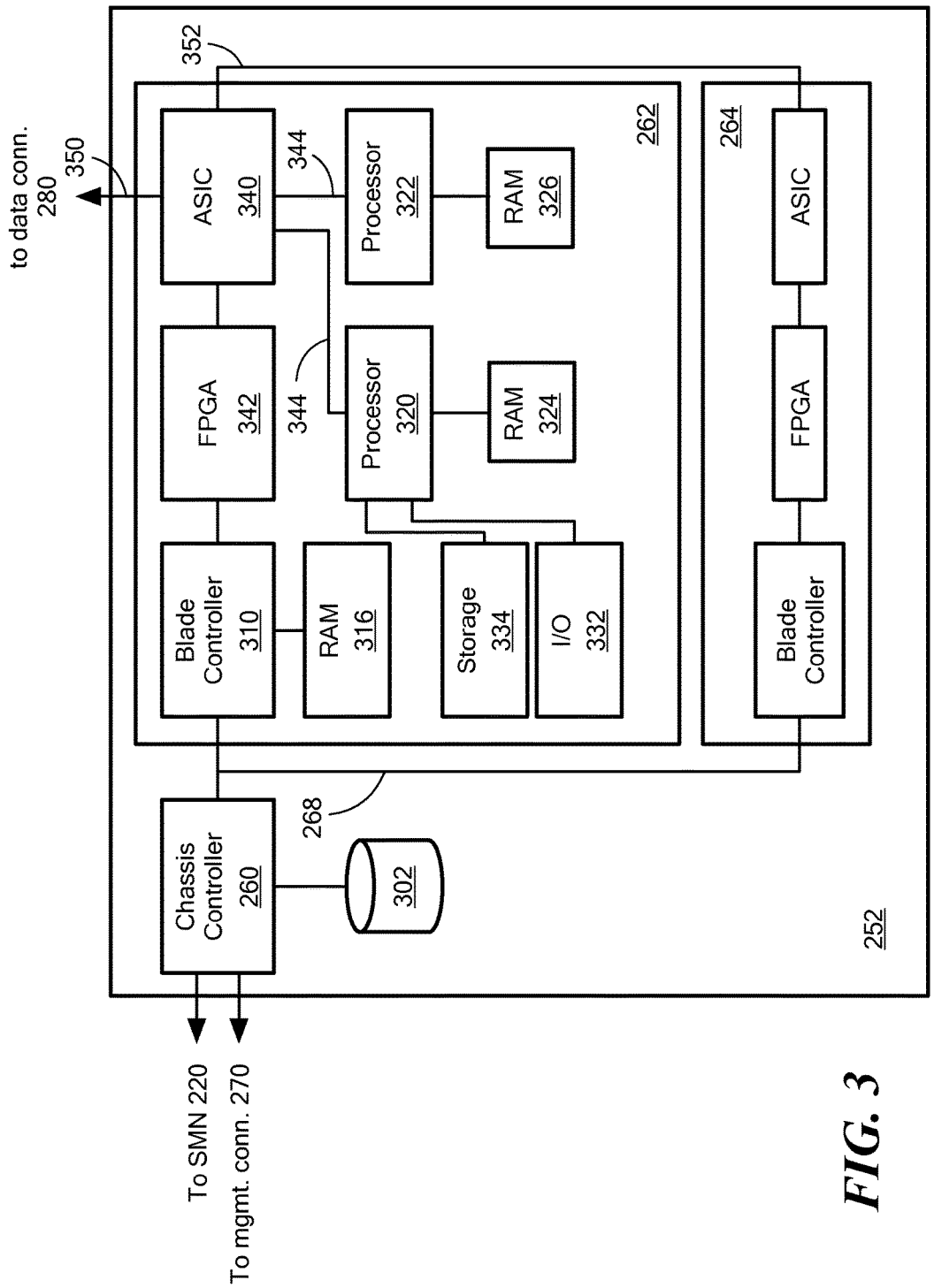
FIG. 3 schematically shows details of an exemplary blade chassis of the HPC system of FIG. 1.

FIG. 3 schematically shows a single blade chassis 252 in more detail. In this figure, parts not relevant to the immediate description have been omitted. The chassis controller 260 is shown with its connections to the system management node 220 and to the management connection 270. The chassis controller 260 may be provided with a chassis data store 302 for storing chassis management data. The chassis data store 302 may be volatile random access memory ("RAM"), in which case data in the chassis data store 302 are accessible by the SMN 220 so long as power is applied to the blade chassis 252, even if one or more of the computing partitions has failed (e.g., due to an OS crash) or a blade has malfunctioned. The chassis data store 302 may be non-volatile storage such as a hard disk drive ("HDD") or a solid state drive ("SSD"). In this case, data in the chassis data store 302 are accessible after the HPC system has been powered down and rebooted.

FIG. 3 shows relevant portions of specific implementations of the blades 262 and 264 for discussion purposes. The blade 262 includes a blade management controller 310 (also called a "blade controller" or "BMC") that executes system management functions at a blade level, in a manner analogous to the functions performed by the chassis controller at the chassis level. For more detail on the operations of the chassis controller and blade controller, see the section entitled "System Operation" below. The blade controller 310 may be implemented as custom hardware, designed by the HPC system designer to permit communication with the chassis controller 260. In addition, the blade controller 310 may have its own RAM 316 to carry out its management functions. The chassis controller 260 communicates with the blade controller of each blade using the local management bus 268, as shown in FIG. 3 and the previous figures.

The blade 262 also includes one or more processors 320, 322 that are connected to RAM 324, 326. Blade 262 may be alternately configured so that multiple processors may access a common set of RAM on a single bus, as is known in the art. It should also be appreciated that processors 320, 322 may include any number of central processing units ("CPUs") or cores, as is known in the art. The processors 320, 322 in the blade 262 are connected to other items, such as a data bus that communicates with I/O devices 332, a data bus that communicates with non-volatile storage 334, and other buses commonly found in standalone computing systems. (For clarity, FIG. 3 shows only the connections from processor 320 to these other devices.) The processors 320, 322 may be, for example, Intel® Core™ processors manufactured by Intel Corporation. The I/O bus may be, for example, a PCI or PCI Express ("PCIe") bus. The storage bus may be, for example, a SATA, SCSI, or Fibre Channel bus. It will be appreciated that other bus standards, processor types, and processor manufacturers may be used with illustrative embodiments of the present invention.

Each blade (e.g., the blades 262 and 264) includes an application-specific integrated circuit 340 (also referred to as an "ASIC", "hub chip", or "hub ASIC") that controls much of its functionality. More specifically, to logically connect the processors 320, 322, RAM 324, 326, and other devices 332, 334 together to form a managed, multi-processor, coherently-shared distributed-memory HPC system, the processors 320, 322 are electrically connected to the hub ASIC 340. The hub ASIC 340 thus provides an interface between the HPC system management functions generated by the SMN 220, chassis controller 260, and blade controller 310, and the computing resources of the blade 262.

In this connection, the hub ASIC 340 connects with the blade controller 310 by way of a field-programmable gate array ("FPGA") 342 or similar programmable device for passing signals between integrated circuits. In particular, signals are generated on output pins of the blade controller 310, in response to commands issued by the chassis controller 260. These signals are translated by the FPGA 342 into commands for certain input pins of the hub ASIC 340, and vice versa. For example, a "power on" signal received by the blade controller 310 from the chassis controller 260 requires, among other things, providing a "power on" voltage to a certain pin on the hub ASIC 340; the FPGA 342 facilitates this task.

The field-programmable nature of the FPGA 342 permits the interface between the blade controller 310 and ASIC 340 to be reprogrammable after manufacturing. Thus, for example, the blade controller 310 and ASIC 340 may be designed to have certain generic functions, and the FPGA 342 may be used advantageously to program the use of those functions in an application-specific way. The communications interface between the blade controller 310 and ASIC 340 also may be updated if a hardware design error is discovered in either module, permitting a quick system repair without requiring new hardware to be fabricated.

Also in connection with its role as the interface between computing resources and system management, the hub ASIC 340 is connected to the processors 320, 322 by way of a high-speed processor interconnect 344. In one embodiment, the processors 320, 322 are manufactured by Intel Corporation which provides the Intel® QuickPath Interconnect ("QPI") for this purpose, and the hub ASIC 340 includes a module for communicating with the processors 320, 322 using QPI. Other embodiments may use other processor interconnect configurations.

The hub chip 340 in each blade also provides connections to other blades for high-bandwidth, low-latency data communications. Thus, the hub chip 340 includes a link 350 to the computing connection 280 that connects different blade chassis. This link 350 may be implemented using networking cables, for example. The hub ASIC 340 also includes connections to other blades in the same blade chassis 252. The hub ASIC 340 of blade 262 connects to the hub ASIC 340 of blade 264 by way of a chassis computing connection 352. The chassis computing connection 352 may be implemented as a data bus on a backplane of the blade chassis 252 rather than using networking cables, advantageously allowing the very high speed data communication between blades that is required for high-performance computing tasks. Data communication on both the inter-chassis computing connection 280 and the intra-chassis computing connection 352 may be implemented using the NumaLink protocol or a similar protocol.

System Operation

System management commands generally propagate from the SMN 220, through the management connection 270 to the blade chassis (and their chassis controllers), then to the blades (and their blade controllers), and finally to the hub ASICS that implement the commands using the system computing hardware.

For example, consider the process of powering on an HPC system. The HPC system 100 is powered when a system operator issues a "power on" command from the SMN 220. The SMN 220 propagates this command to each of the blade chassis 252-258 by way of their respective chassis controllers, such as chassis controller 260 in blade chassis 252. Each chassis controller, in turn, issues a "power on" command to each of the respective blades in its blade chassis by way of their respective blade controllers, such as blade controller 310 of blade 262. Blade controller 310 issues a "power on" command to its corresponding hub chip 340 using the FPGA 342, which provides a signal on one of the pins of the hub chip 340 that allows it to initialize. Other commands propagate similarly.

Once the HPC system is powered on, its computing resources may be divided into computing partitions. The quantity of computing resources that are allocated to each computing partition is an administrative decision. For example, an enterprise may have a number of projects to complete, and each project is projected to require a certain amount of computing resources. Different projects may require different proportions of processing power, memory, and I/O device usage, and different blades may have different quantities of the resources installed. The HPC system administrator takes these considerations into account when partitioning the computing resources of the HPC system 100. Partitioning the computing resources may be accomplished by programming each blade's RAM 316. For example, the SMN 220 may issue appropriate blade programming commands after reading a system configuration file.

The collective hardware computing resources of the HPC system 100 may be divided into computing partitions according to any administrative need. Thus, for example, a single computing partition may include the computing resources of some or all of the blades of one blade chassis 252, all of the blades of multiple blade chassis 252 and 254, some of the blades of one blade chassis 252 and all of the blades of blade chassis 254, all of the computing resources of the entire HPC system 100, or other similar combinations. Hardware computing resources may be partitioned statically, in which case a reboot of the entire HPC system 100 is required to reallocate hardware. Alternatively and preferably, hardware computing resources are partitioned dynamically while the HPC system 100 is powered on. In this way, unallocated resources may be assigned to a partition without interrupting the operation of other partitions.

It should be noted that once the HPC system 100 has been appropriately partitioned, each partition may be considered to act as a standalone computing system. Thus, two or more partitions may be combined to form a logical computing group inside the HPC system 100. Such grouping may be necessary if, for example, a particular computational task is allocated more processors or memory than a single operating system can control. For example, if a single operating system can control only 64 processors, but a particular computational task requires the combined power of 256 processors, then four partitions may be allocated to the task in such a group. This grouping may be accomplished using techniques known in the art, such as installing the same software on each computing partition and providing the partitions with a VPN.

Once at least one partition has been created, the partition may be booted and its computing resources initialized. Each computing partition, such as partition 160, may be viewed logically as having a single OS 191 and a single BIOS 192. As is known in the art, a BIOS is a collection of instructions that electrically probes and initializes the available hardware to a known state so that the OS can boot, and is typically provided in a firmware chip on each physical server. However, a single logical computing partition 160 may span several blades, or even several blade chassis. A blade may be referred to as a "computing node" or simply a "node" to emphasize its allocation to a particular partition; however, it will be understood that a physical blade may comprise more than one computing node if it has multiple processors 320, 322 and memory 324, 326.

Booting a partition may require a number of modifications to be made to a standard blade chassis. In particular, the BIOS in each blade is modified to determine other hardware resources in the same computing partition, not just those in the same blade or blade chassis. After a boot command has been issued by the SMN 220, the hub ASIC 340 eventually provides an appropriate signal to the processor 320 to begin the boot process using BIOS instructions. The BIOS instructions, in turn, obtain partition information from the hub ASIC 340 such as: an identification (node) number in the partition, a node interconnection topology, a list of devices that are present in other nodes in the partition, a master clock signal used by all nodes in the partition, and so on. Armed with this information, the processor 320 may take whatever steps are required to initialize the blade 262, including 1) non-HPC-specific steps such as initializing I/O devices 332 and non-volatile storage 334, and 2) also HPC-specific steps such as synchronizing a local hardware clock to a master clock signal, initializing HPC-specialized hardware in a given node, managing a memory directory that includes information about which other nodes in the partition have accessed its RAM, and preparing a partition-wide physical memory map.

At this point, each physical BIOS has its own view of the partition, and all of the computing resources in each node are prepared for the OS to load. The BIOS then reads the OS image and executes it, in accordance with techniques known in the art of multiprocessor systems. The BIOS presents to the OS a view of the partition hardware as if it were all present in a single, very large computing device, even if the hardware itself is scattered among multiple blade chassis and blades. In this way, a single OS instance spreads itself across some, or preferably all, of the blade chassis and blades that are assigned to its partition. Different operating systems may be installed on the various partitions. If an OS image is not present, for example immediately after a partition is created, the OS image may be installed using processes known in the art before the partition boots.

Once the OS is safely executing, its partition may be operated as a single logical computing device. Software for carrying out desired computations may be installed to the various partitions by the HPC system operator. Users may then log into the SMN 220. Access to their respective partitions from the SMN 220 may be controlled using volume mounting and directory permissions based on login credentials, for example. The system operator may monitor the health of each partition, and take remedial steps when a hardware or software error is detected. The current state of long-running application programs may be saved to non-volatile storage, either periodically or on the command of the system operator or application user, to guard against losing work in the event of a system or application crash. The system operator or a system user may issue a command to shut down application software. Other operations of an HPC partition may be known to a person having ordinary skill in the art. When administratively required, the system operator may shut down a computing partition entirely, reallocate or deallocate computing resources in a partition, or power down the entire HPC system 100.

Closed-Loop Cooling Cell Configuration

Figure 4:
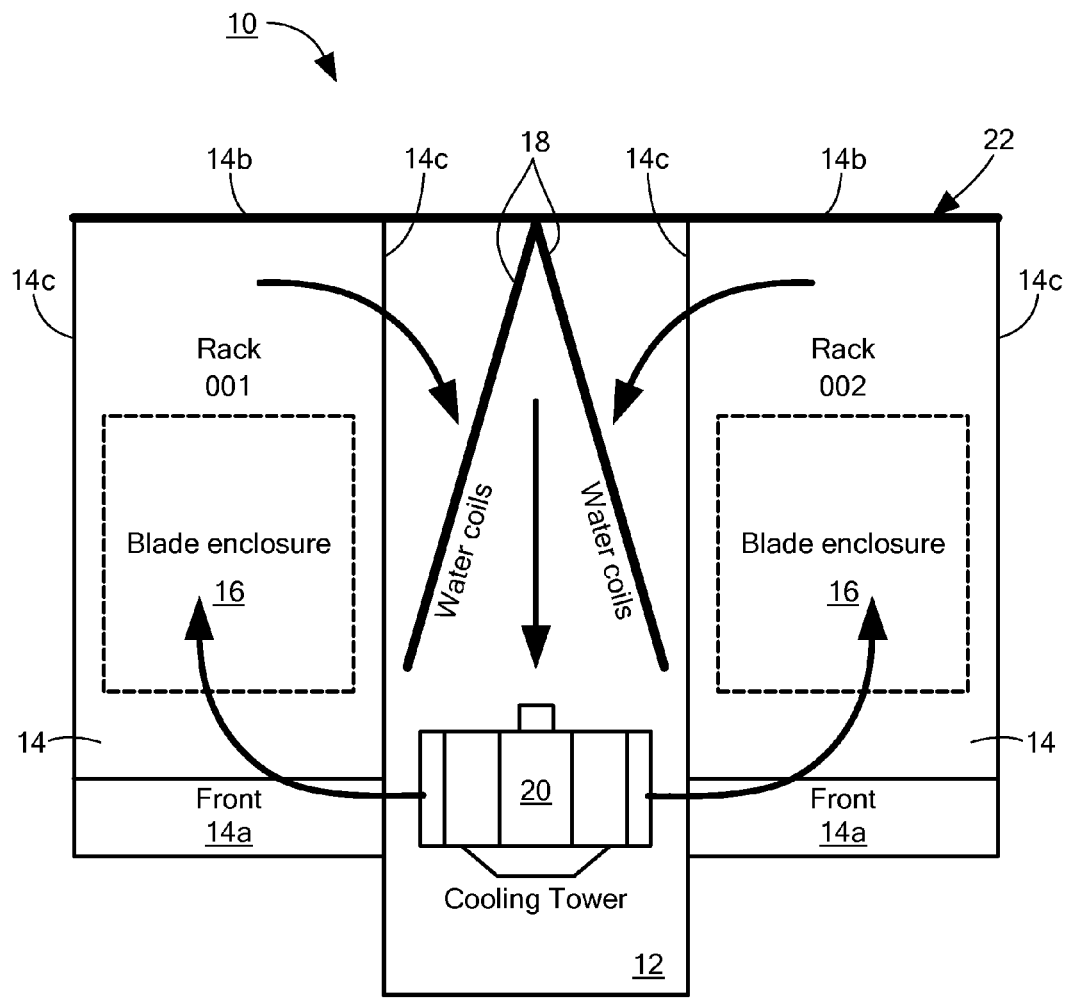
FIG. 4 schematically shows a plan view of a closed-loop cooling cell with two compute racks and one cooling tower in accordance with an embodiment of the present invention.

FIG. 4 shows a plan view of a closed-loop cooling cell 10 used in a cooling system according to embodiments of the present invention. The cooling cell 10 includes a cooling tower 12 between two compute racks 14. Each compute rack 14 includes at least one blade enclosure 16 and has a front 14a, a back 14b, and two sides 14c. The cooling tower 12 includes at least one water-cooled heat exchanger 18 and one or more blowers 20 positioned toward the front of the cooling tower 12. The cooling cell 10 further includes a housing 22 enclosing the compute racks 14 and the cooling tower 12 to provide a closed-loop air flow within the cooling cell 10. To this end, the compute racks 14 and cooling tower 12 are joined at the sides 14c, and the top, bottom, and all sides of the racks 12, 14 are sealed. For example, the front and rear doors may be solid doors, rather than the standard doors that contain perforated holes. In this way, a sealed unit is formed that is isolated from the computer room air.

Figure 5:
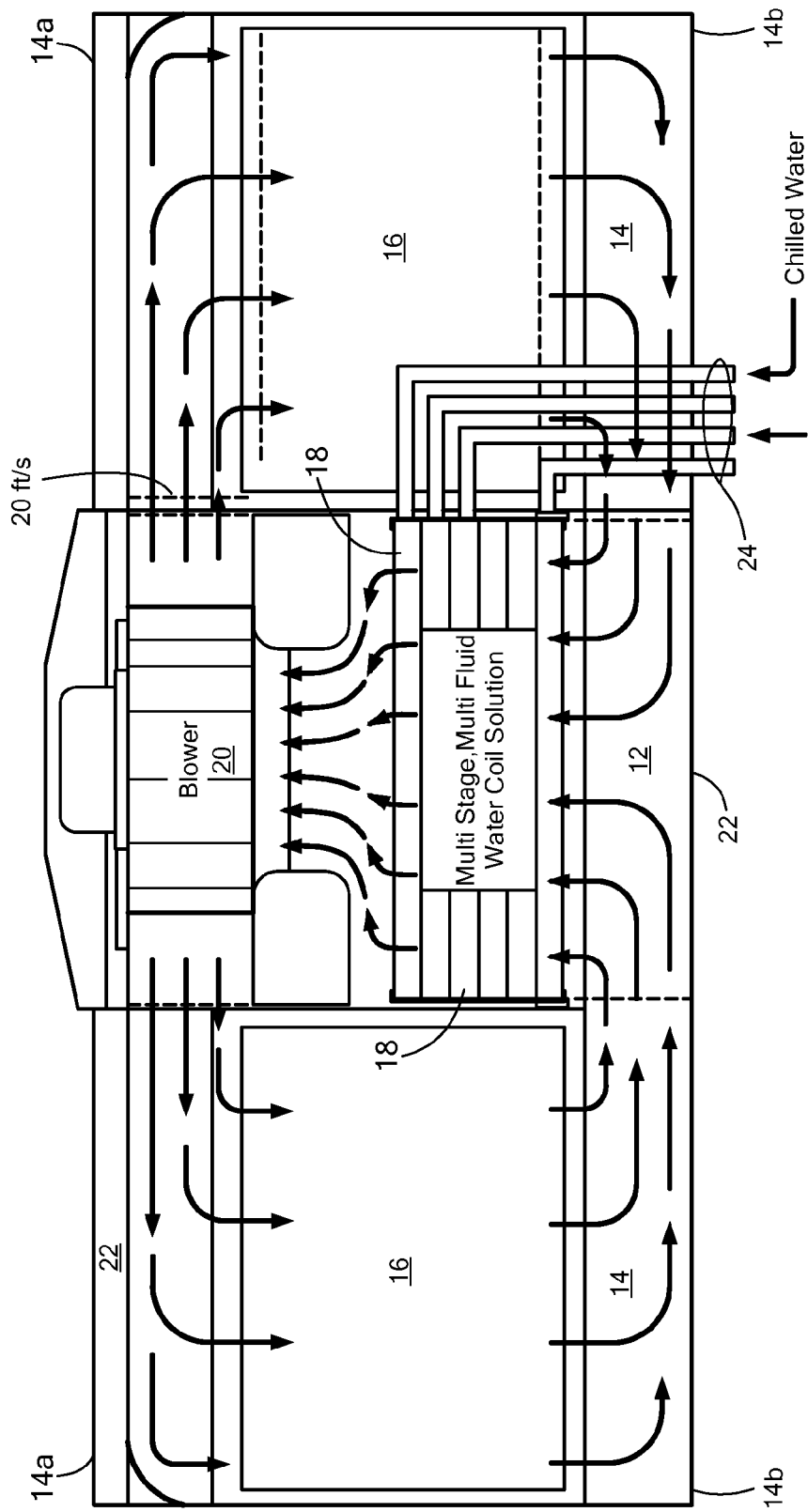
FIG. 5 schematically shows the air flow in the closed-loop cooling cell of FIG. 4.

Referring also to FIG. 5, in operation, the one or more blowers 20 are configured to draw warm air from the side of the compute racks 14 towards the back 14b, across the water-cooled heat exchanger(s) 18, and to circulate cooled air to the side of the compute racks 14 towards the front 14a. The arrows show the closed-loop air flow within the cooling cell 10 when the cooling system is in operation. In this way, the blower(s) 20 in the cooling tower 12 are used to force conditioned air from the front of the compute rack 14 to the rear through the blade enclosures 16 in order to cool the compute blades. The cooling tower 12 removes the heat from the cooling cell 10 via the water-cooled heat exchanger(s) 18 (e.g., water coils). The water-cooled heat exchanger(s) 18 may be connected to a broad range of facilities supplied cooling water via hot and cold water lines 24 (e.g., in the range of about 45-85 degrees Fahrenheit). Higher water temperature limits may enable more hours of free cooling, where the water can be supplied without the need for operating a chiller unit. Alternatively, the water-cooled heat exchanger(s) 18 may be connected to an external heat exchanger, e.g., a chiller unit (not shown), via the water lines 24 in order to supply a cooler water temperature. Preferably, the cooling tower 12 has a cooling capacity of around 160 kW.

The closed-loop cooling cell 10 configuration of the present invention provides several benefits. Each cooling cell 10 has integrated hot aisle containment with substantially no air from within the cooling cell 10 mixing with air in the data center. All air within the cooling cell 10 is water cooled. In addition, this closed-loop airflow arrangement has the benefit of reducing acoustic emissions relative to open-loop systems since larger blowers run at lower RPMs and make less noise than small diameter fans. This approach also provides greater efficiency over rack-level cooling, decreasing power costs associated with cooling since fewer blowers/fans are needed, and utilizing a single water source. In situations where additional cooling is needed, a liquid-to-water heat exchanger (the CDU) may be used, along with on-blade cooling, as discussed further in the section entitled "Cooling Distribution Unit with On-Blade Cooling" below.

Figure 6:
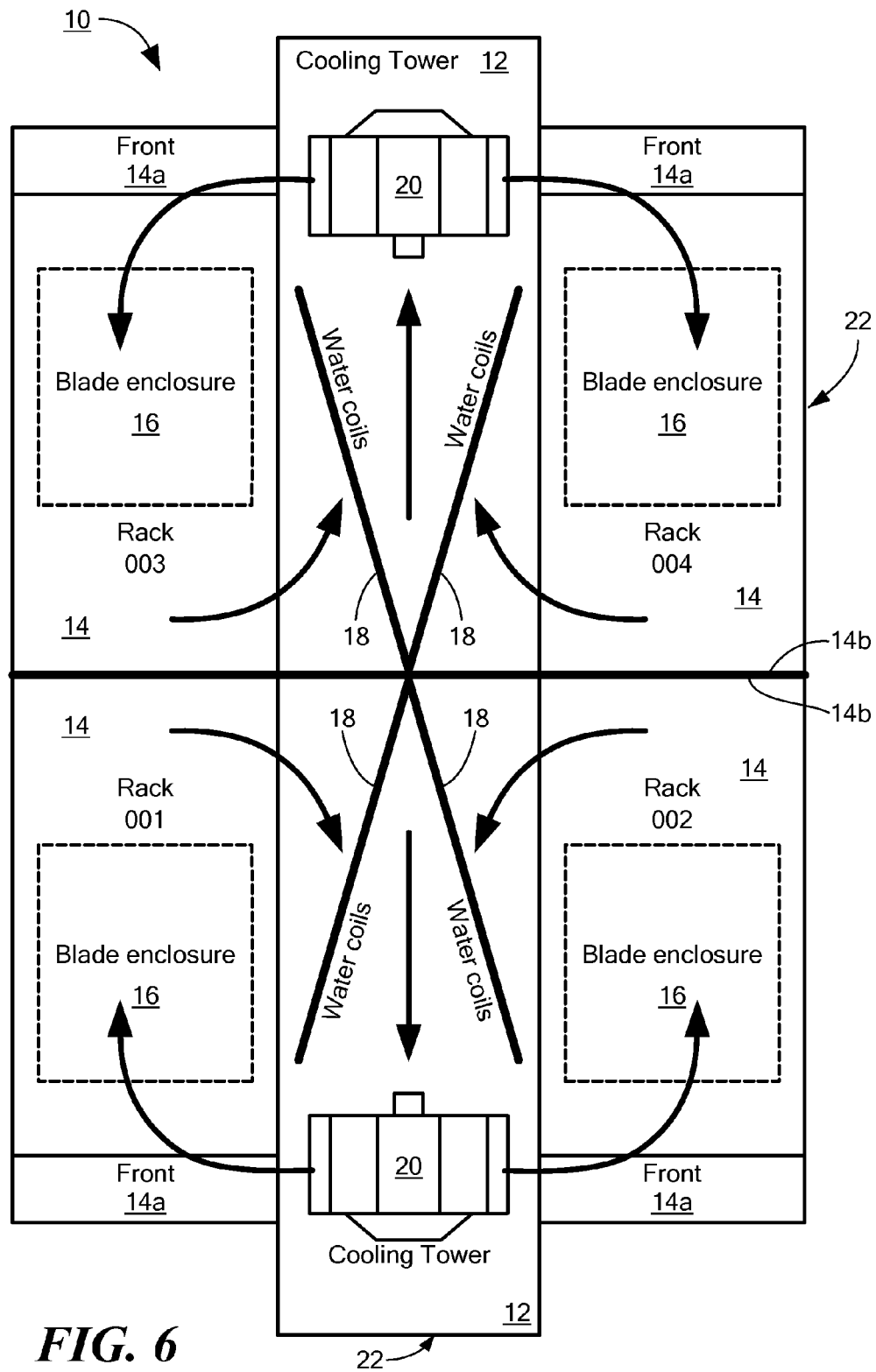
FIG. 6 schematically shows a cooling system with two closed-loop cooling cells each having two compute racks and one cooling tower in accordance with an embodiment of the present invention.

Although FIGS. 4 and 5 show a cooling system having one cooling cell 10 with two compute racks 14 and one cooling tower 12, the cooling system may have one or more cooling cells 10 in accordance with embodiments of the present invention. For example, FIG. 6 schematically shows a cooling system with two closed-loop cooling cells 10 each having two compute racks 14 and one cooling tower 12. When two cooling cells 10 are used, the cooling cells 10 are positioned back-to-back so that the back 14b of the compute racks 14 of the one cooling cell 10 is abutting the back 14b of the compute racks 14 in the other cooling cell 10. The housing 22 encloses the cooling cells 10 to provide two closed-loop air flows within the cooling system, as shown with the arrows in FIG. 6. Multiple cooling cells 10 may be placed next to each other to scale the system to cool any number of compute blades, e.g., tens of thousands of compute blades. When configuring multiple cooling cells 10, electrical cabling between the cooling cells 10 may be routed in the space between the top of the compute rack 14 and the housing 22 on the top of the cooling cell 10.

Figure 7:
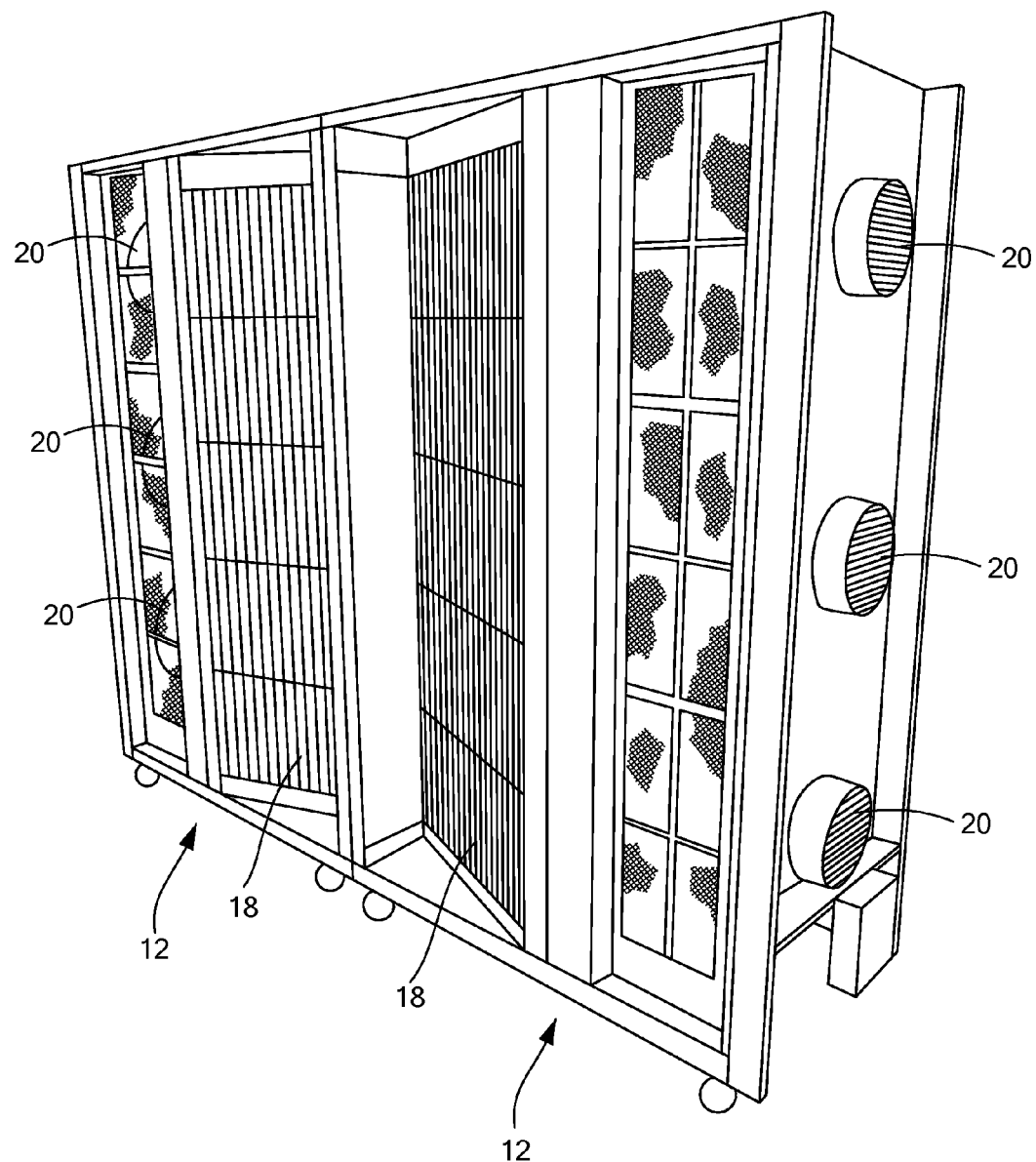
FIG. 7 shows two cooling towers back-to-back in accordance with an embodiment of the present invention.
Figure 8:
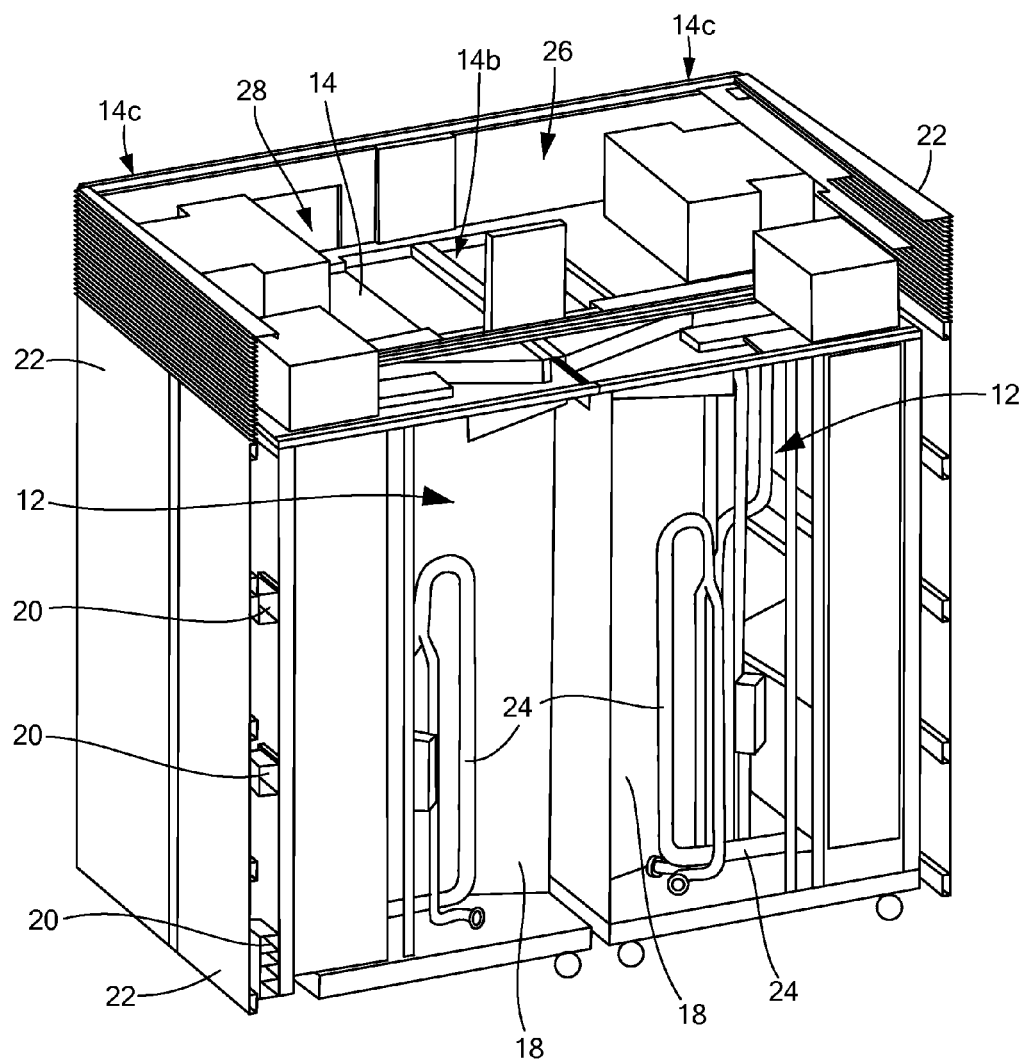
FIG. 8 schematically shows a perspective, cross-sectional view of FIG. 6 with portions of the cooling system removed.

FIG. 7 shows two cooling towers 12 back-to-back without the compute racks 14 attached. Preferably, each cooling tower 12 may have three large blowers 20 and may have two water-cooled heat exchangers 18 positioned in a v-shape such that the open side of the v-shape faces the blowers 20. FIG. 8 schematically shows a perspective, cross-sectional view of FIG. 6 with one side of the compute racks 14 and a portion of the cooling tower 12 removed for both cooling cells 10. In addition, the top of the housing 22 is removed to show the space 26 between the top of the compute rack 14 and the housing 22 where electrical cabling may be routed from one cooling cell 10 to another at the side 14c of the cooling cell 10, e.g., through side opening 28 in housing 22.

Figure 9B:
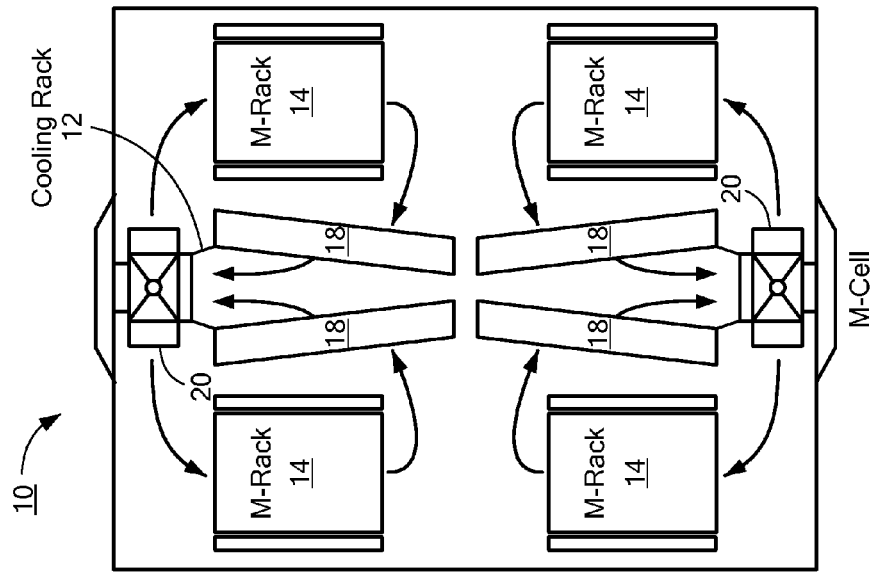
FIGS. 9A and 9B schematically show D-Rack and M-Rack configurations, respectively, used with embodiments of the present invention.
Figure 9A:
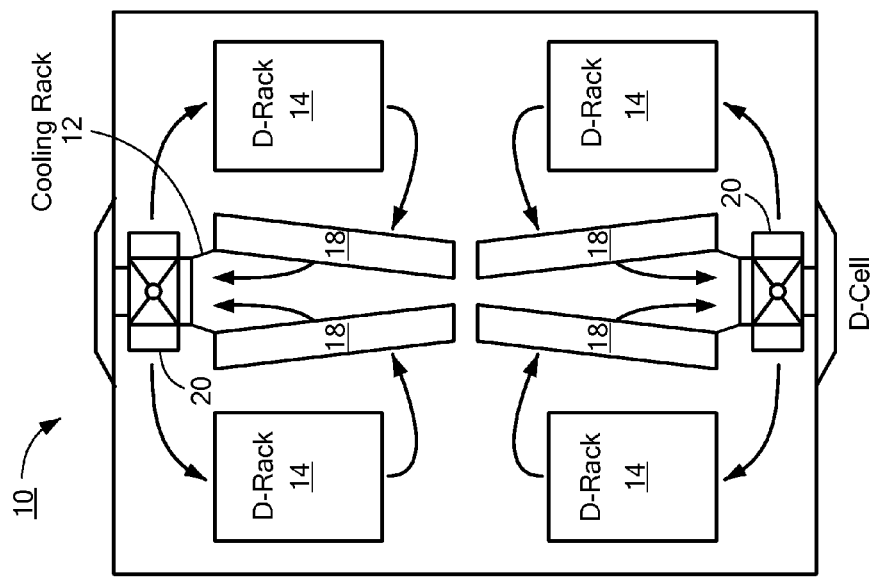
Figure 10A:
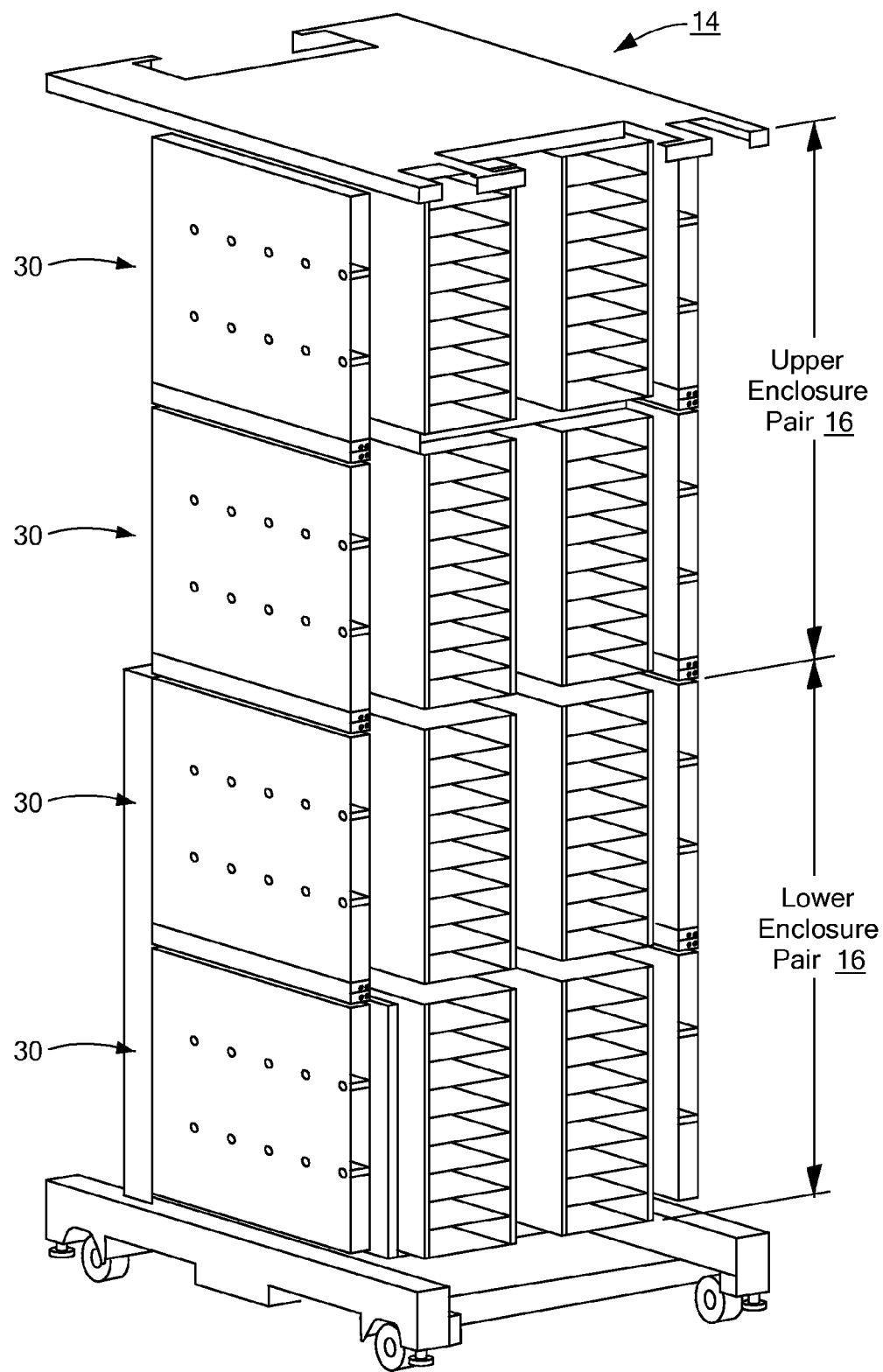
FIGS. 10A through 10D schematically show various views of the M-Rack configuration used with embodiments of the present invention.
Figure 10B:
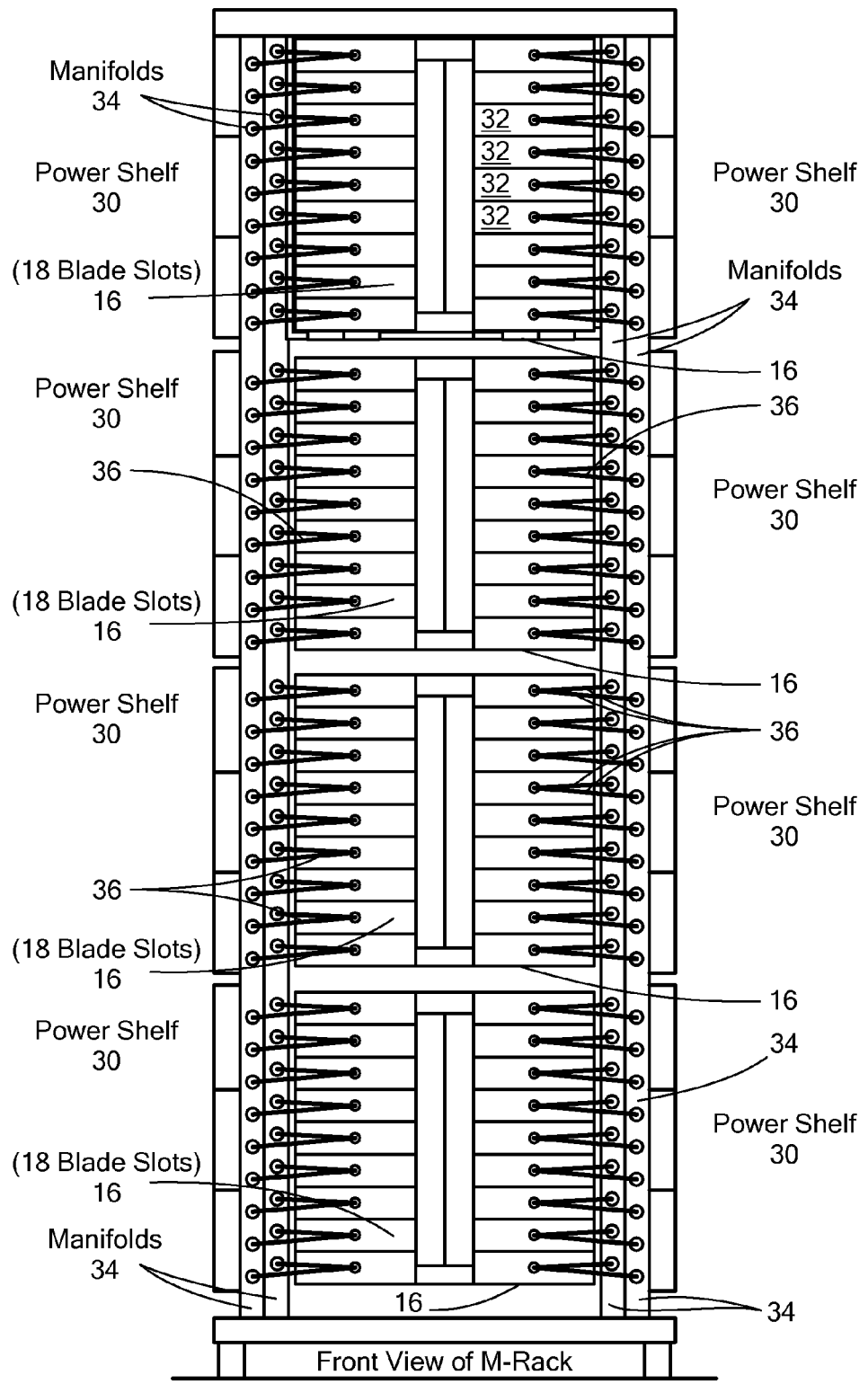
Figure 10C:
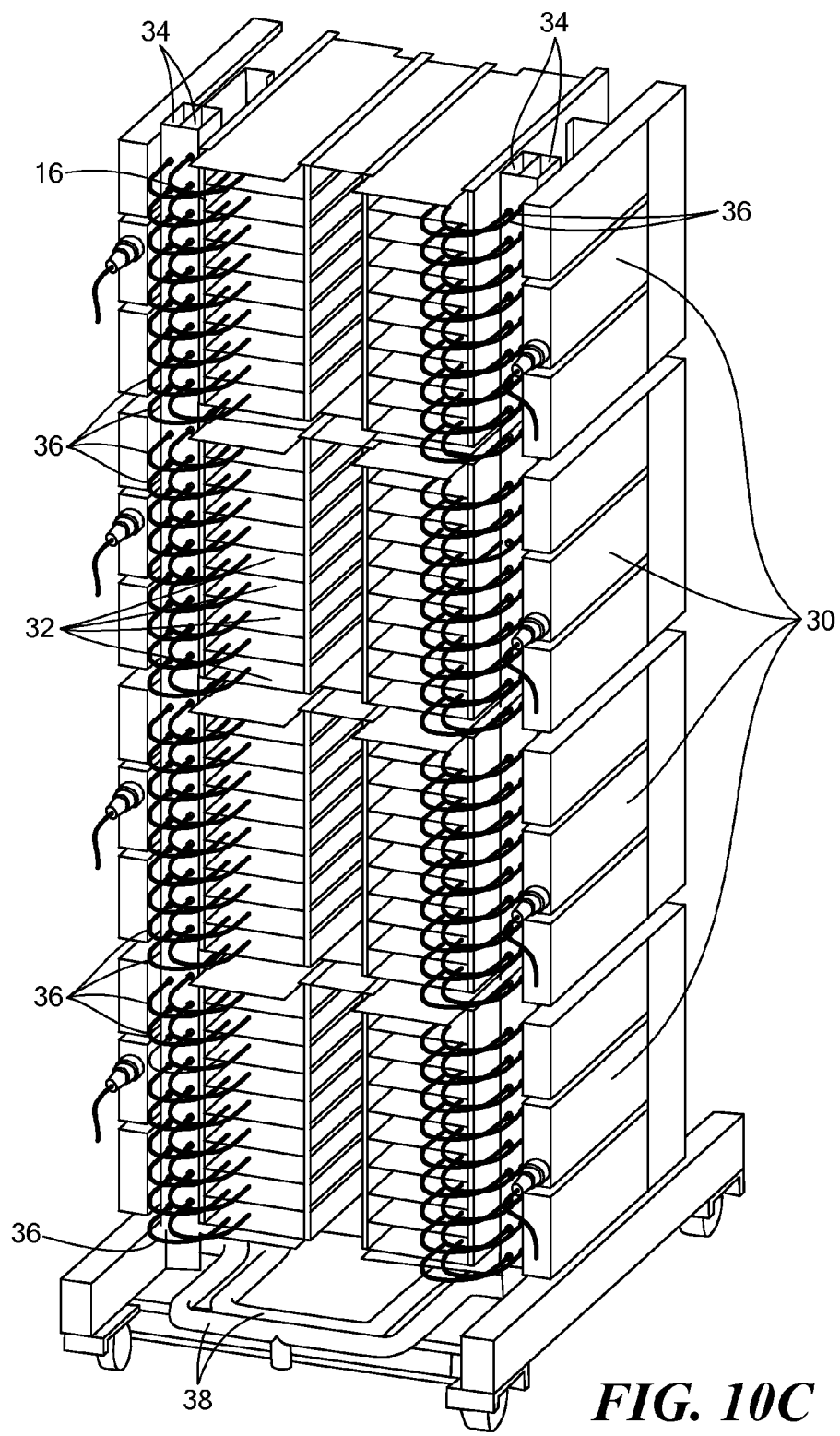
Figure 10D:
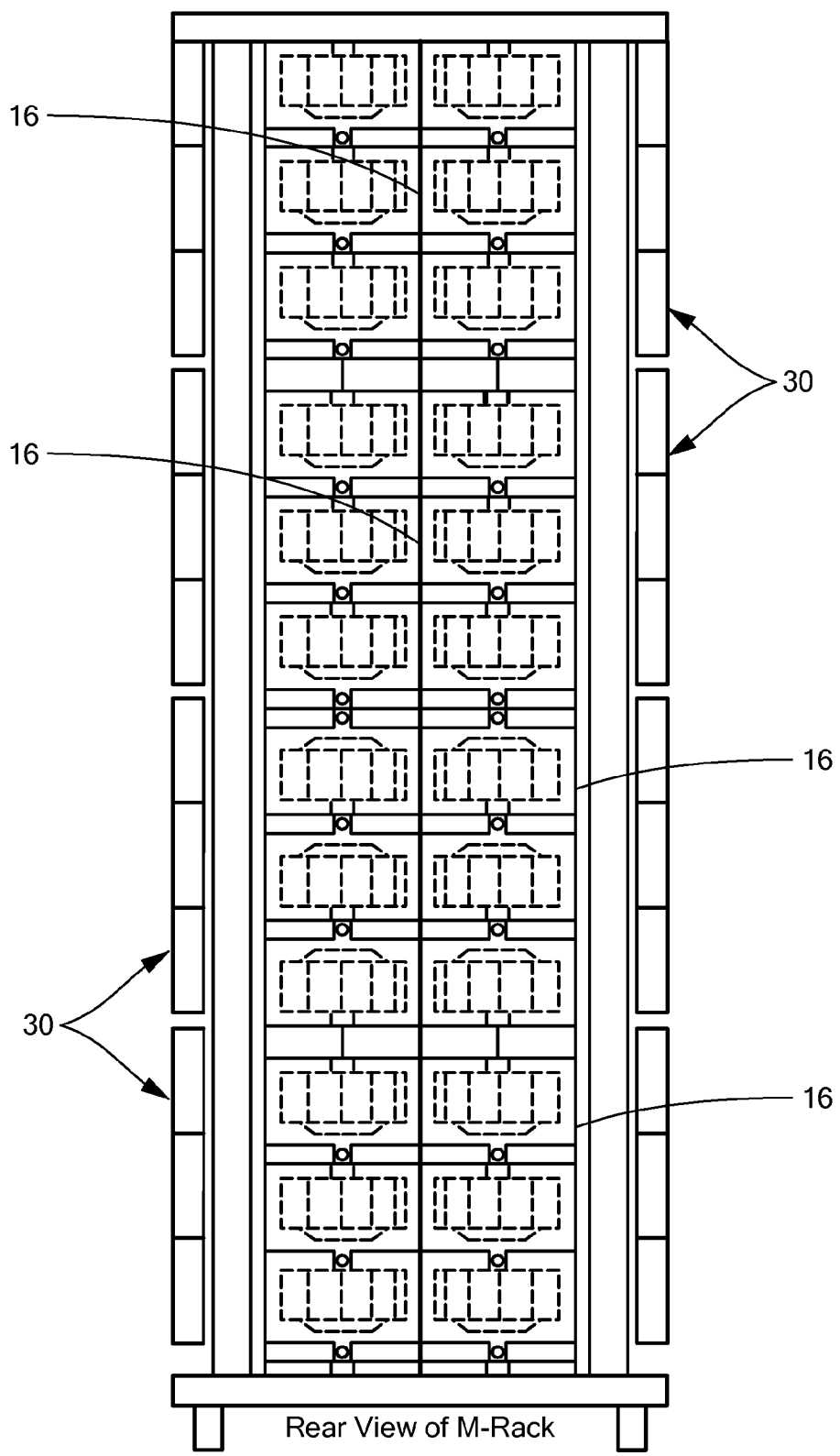
Figure 11A:
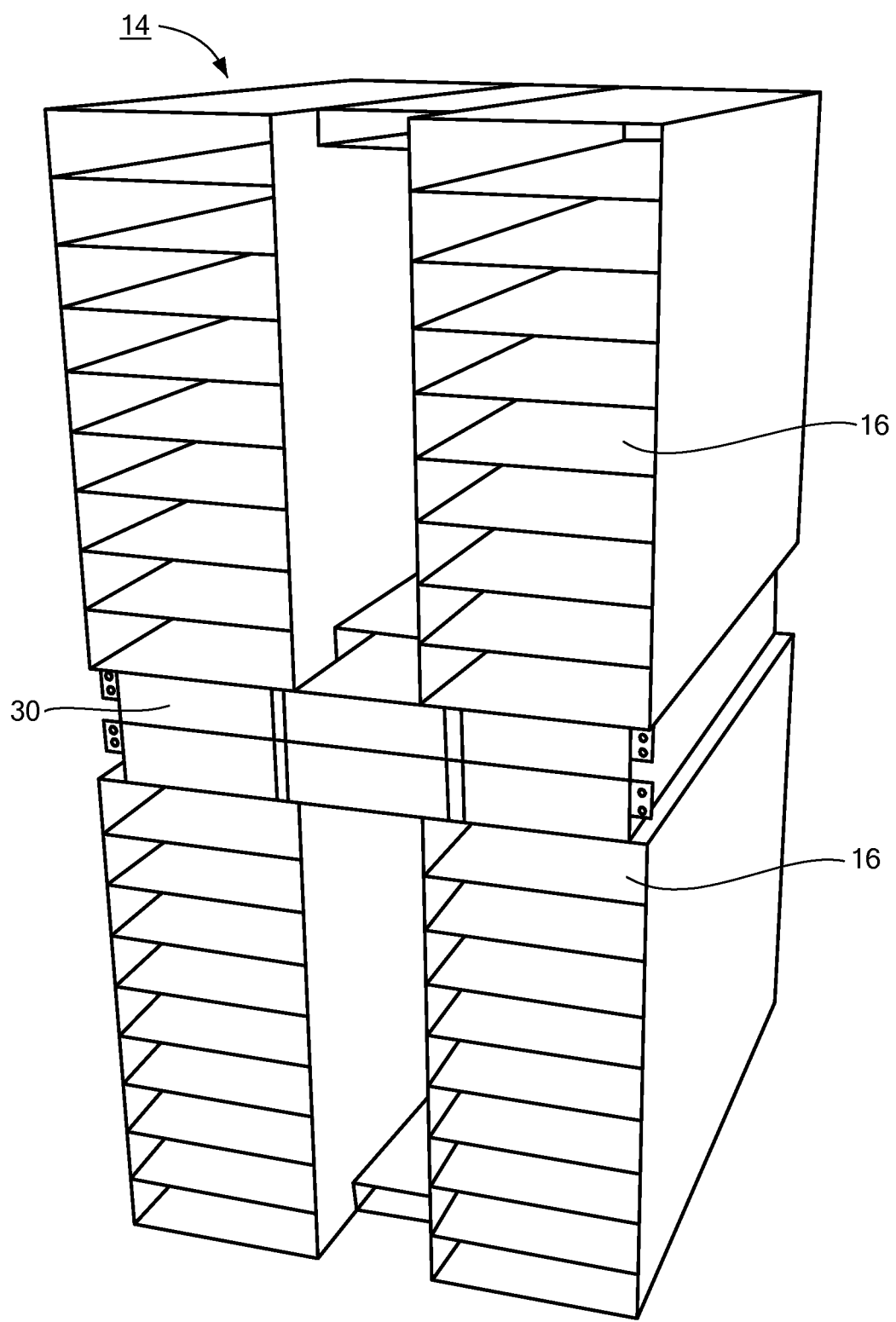
FIGS. 11A through 11C schematically show various views of the D-Rack configuration used with embodiments of the present invention.
Figure 11B:
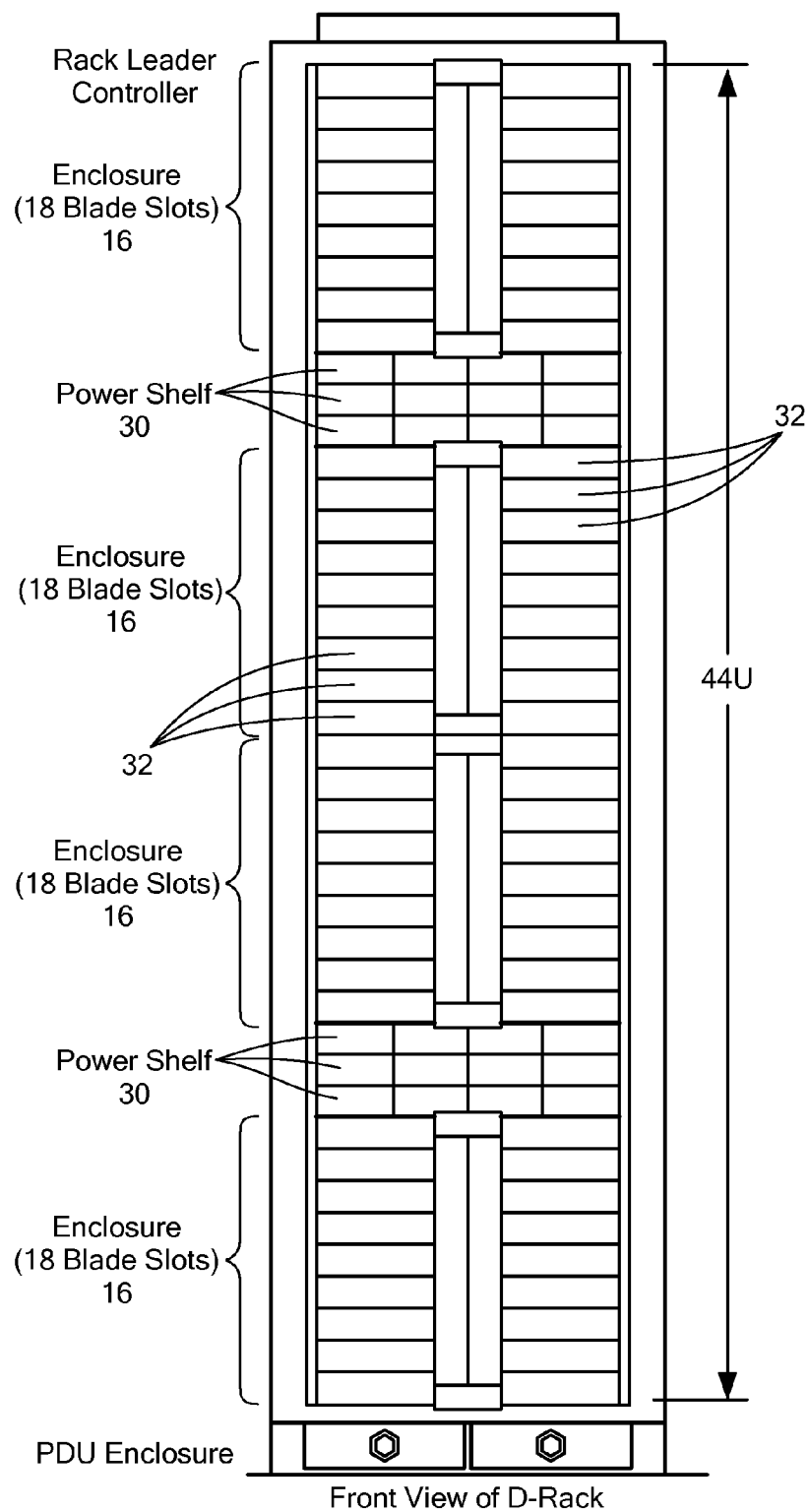
Figure 11C:
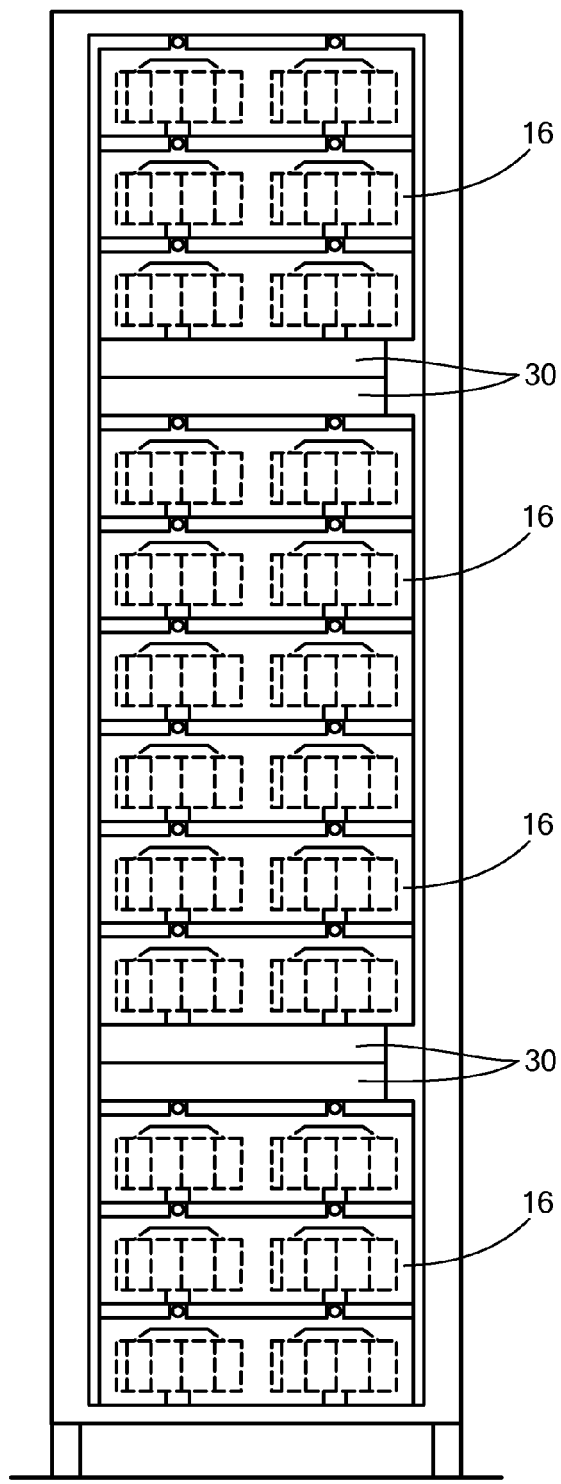

Embodiments of the cooling system with the closed-loop cooling cell 10 may be used with various compute rack configurations. For example, as shown in FIGS. 9A and 9B, the cooling tower 12 may be used with D-Rack and M-Rack configurations. FIGS. 10A through 10D schematically show various views of an M-Rack configuration, and FIGS. 11A through 11C schematically show various views of a D-Rack configuration. Specifically, FIG. 10A shows a perspective, front view of an M-Rack compute rack 14 with an upper blade enclosure 16 and a lower blade enclosure 16 and with four power shelves 30 attached to the side of the blade enclosures 16. FIGS. 10B and 10C show a front view and a front perspective view, respectively, of the M-Rack compute rack 14 with blades 32 installed in the blade enclosures 16 and connected to cooling manifolds 34 via fluid connections 36. The on-blade cooling configuration using the cooling manifolds 34 and the fluid connections 36 will be discussed further in the section entitled "Cooling Distribution Unit with On-Blade Cooling" below. FIG. 10D shows a rear view of the M-Rack compute rack 14. FIG. 11A shows a perspective, front view of a D-Rack compute rack 14 with an upper blade enclosure 16 and a lower blade enclosure 16 and with power shelves 30 between the blade enclosures 16. FIGS. 11B and 11C show a front view and rear view, respectively, of the D-Rack compute rack 14 with blades 32 installed in the blade enclosures 16.

Cooling Distribution Unit with On-Blade Cooling

Figure 12:
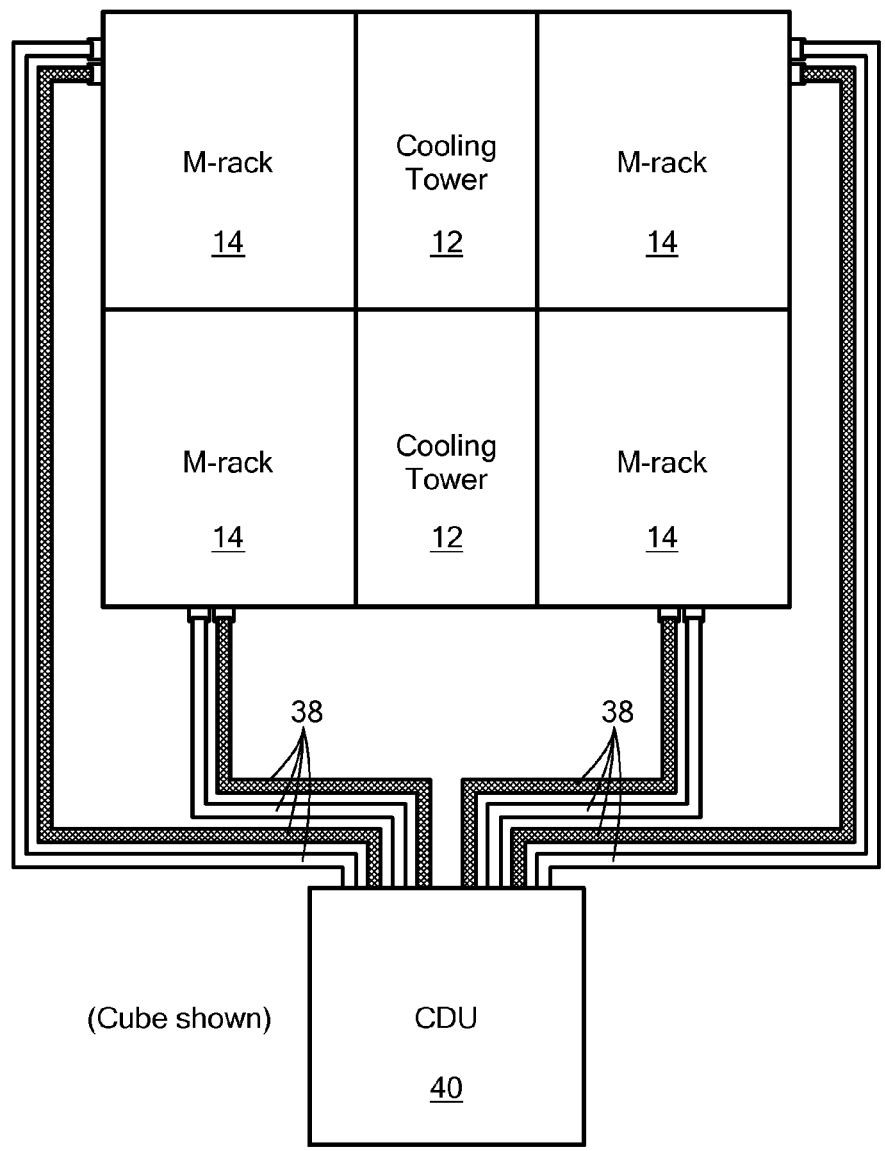
FIG. 12 schematically shows a cooling system with two closed-loop cooling cells and an external cooling distribution unit (CDU) in accordance with an embodiment of the present invention.

As shown in FIG. 12, the cooling system may further include a cooling distribution unit (CDU) 40 that is external to the cooling cell 10 in order to support an increased cooling requirement for certain types of compute blades, e.g., the 720W Gemini Twin compute blade sold by Silicon Graphics International Corp. of Fremont, Calif. For example, when the amount of heat generated by the compute blade exceeds about 600 watts, the CDU may be used in conjunction with an M-rack configuration having on-blade cooling. The CDU 40 may be connected to two compute racks 14 within one cooling cell 10 or may be connected to four compute racks 14, such as shown in FIG. 12, via a set of fluid connections 38, e.g., hoses, one having a supply line and one having a return line.

Figure 13:
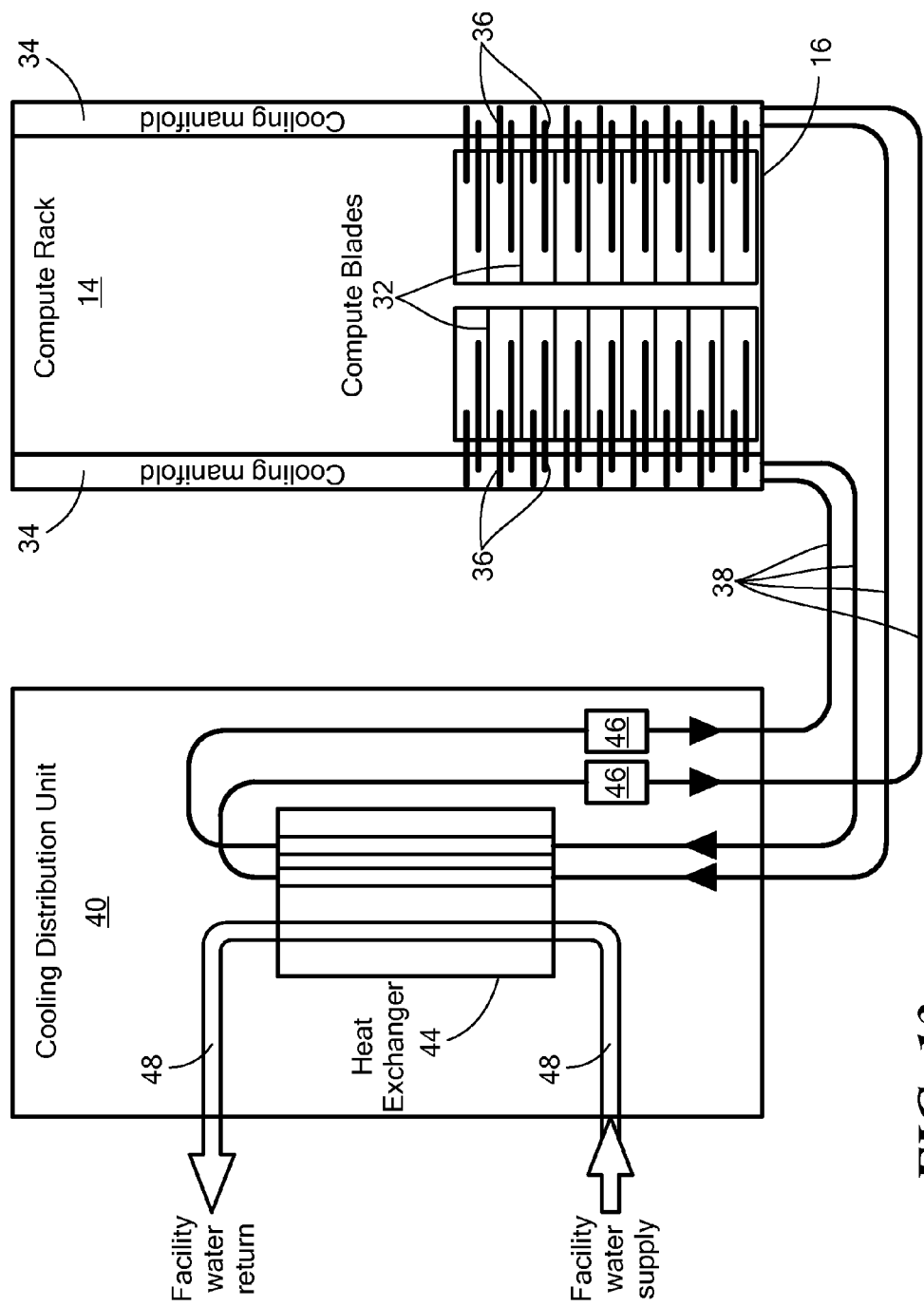
FIG. 13 schematically shows the water flow between one compute rack in a cooling cell and an external cooling distribution unit (CDU) in accordance with an embodiment of the present invention.
Figure 14:
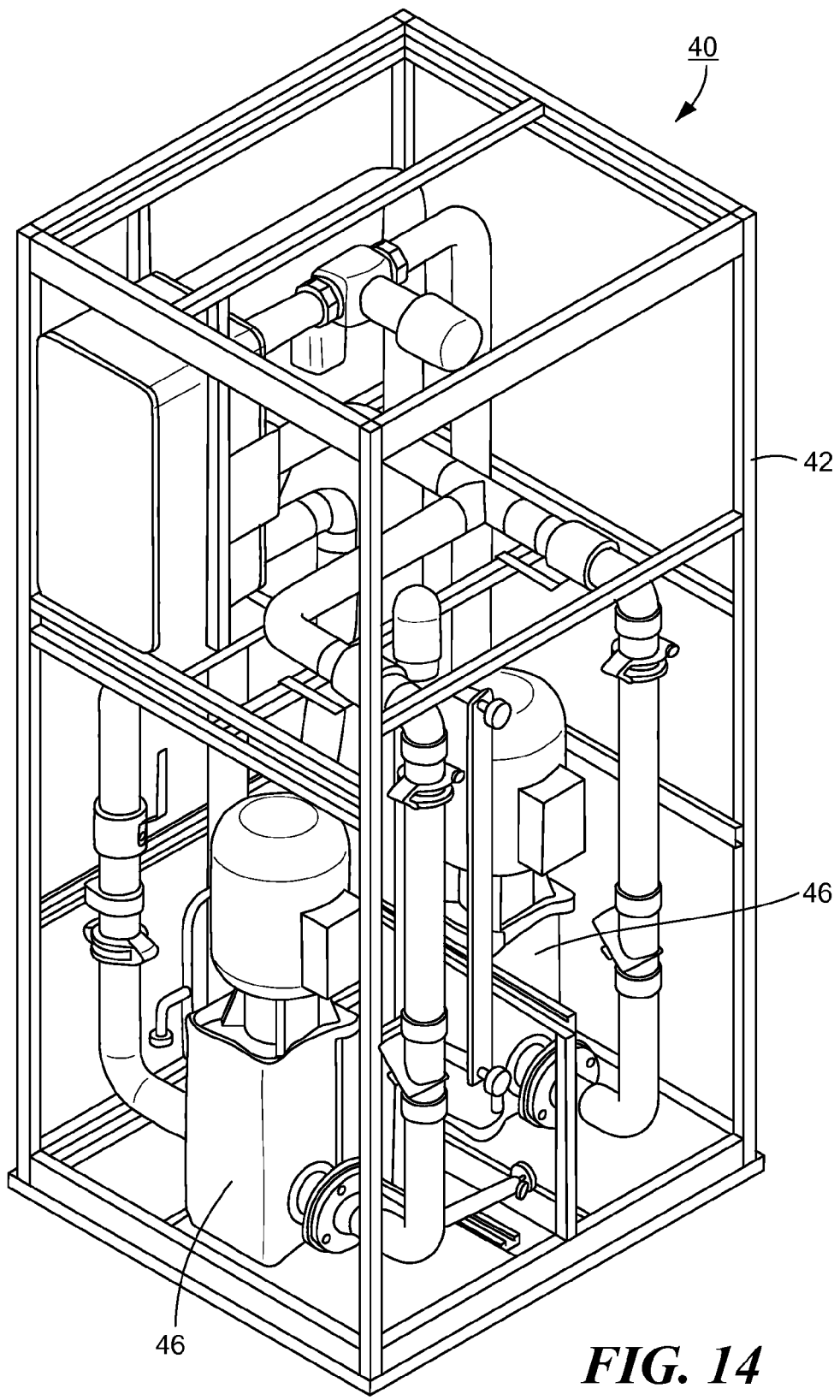
FIG. 14 schematically shows an external cooling distribution unit (CDU), with portions of the housing removed, for use with a cooling system in accordance with an embodiment of the present invention.
Figure 15A:
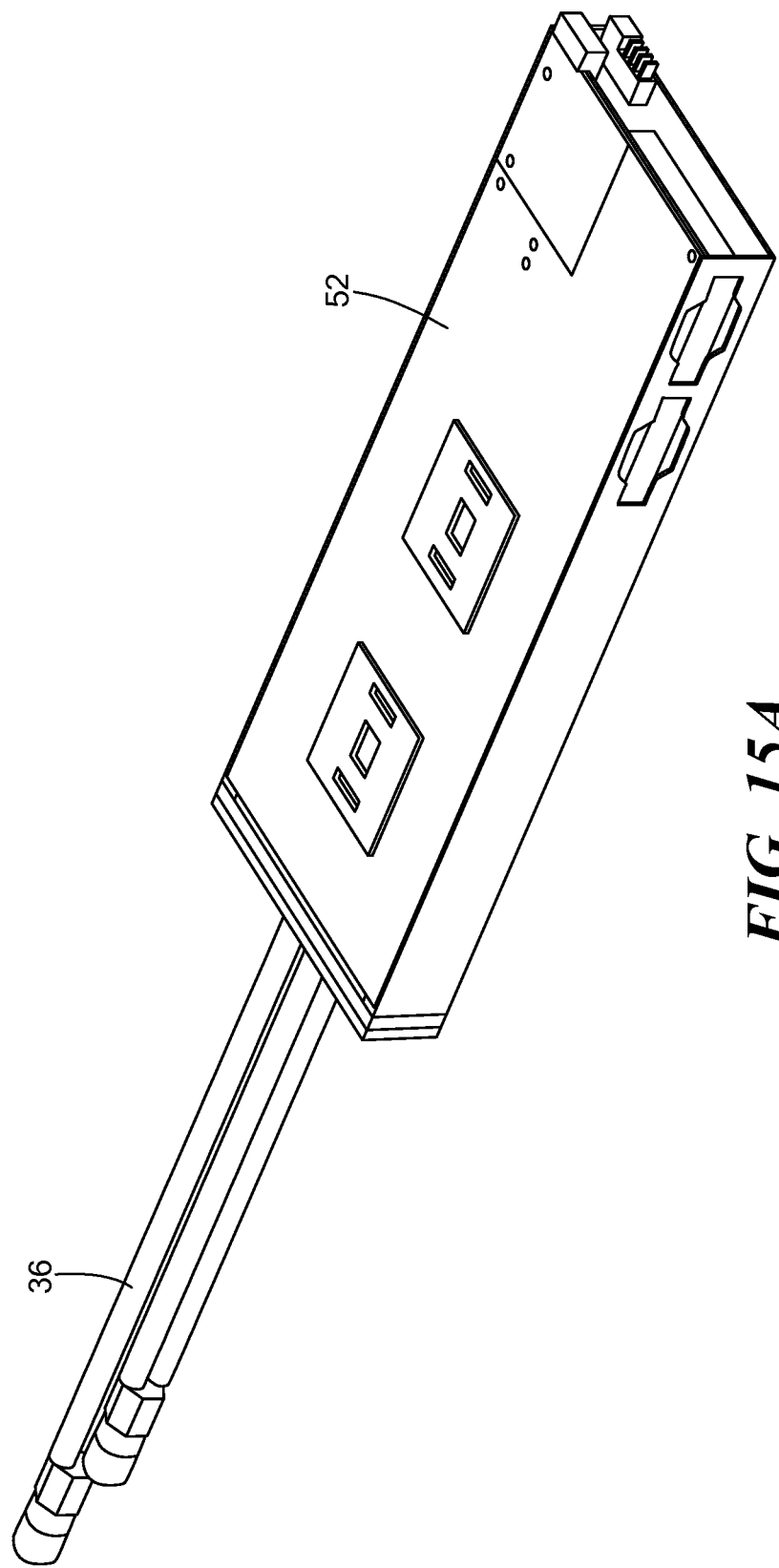
FIGS. 15A and 15B schematically show a top perspective view and an exploded view, respectively, of a blade with an on-blade cold sink for use with embodiments of the present invention.
Figure 15B:
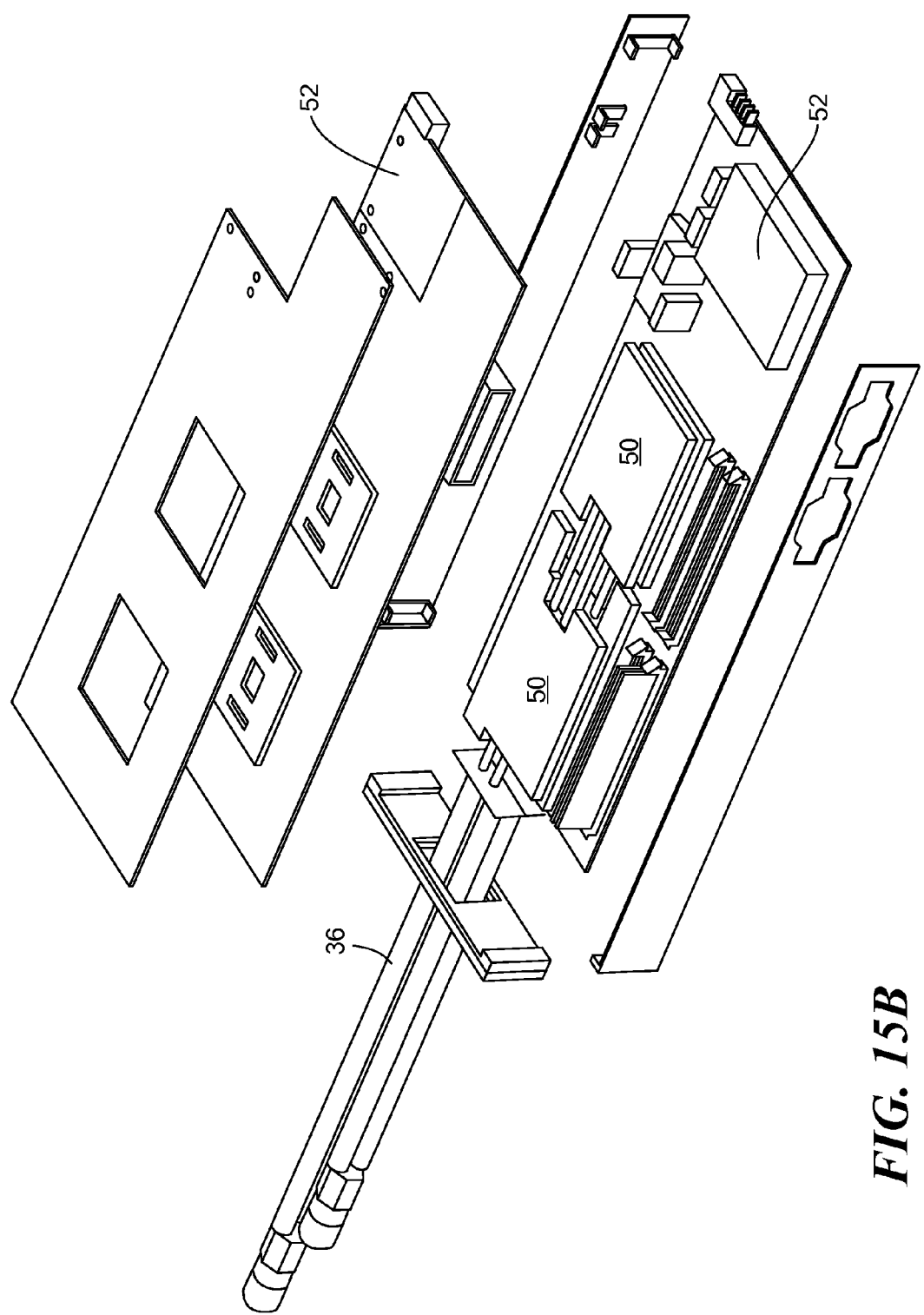

Referring also to FIGS. 13 and 14, the CDU 40 includes a housing 42 that encloses a heat exchanger 44 and one or more circulating pump(s) 46 along with other controls, valves and piping. FIG. 13 shows the coolant path from a CDU 40 to one set of compute racks 14 having cooling manifolds 34 located at the sides of the blade enclosures 16. In operation, the one or more circulating pumps 46 are configured to move cooling liquid within the fluid connections 38 through the cooling manifolds 34 in the compute rack 14 and then through the fluid connections 36 that connect each individual blade 32 to the cooling manifolds 34. The individual blades 32 include one or more liquid-cooled heat sinks 50 internal to the blade 32, such as shown in FIGS. 15A and 15B. The cooling plates 50 are configured to be disposed between two computing boards 52 within the computing blade 32. These liquid-cooled plates 50 have internal passages that allow the cooling liquid (e.g., water) to flow through the passages in order to remove the heat generated by the processors in the blade 32. Further details of the on-blade cold sink configuration can be found in the application Ser. No. 13/931,730 entitled ON-BLADE COLD SINK FOR HIGH-DENSITY CLUSTERED COMPUTER SYSTEM, filed on Jun. 28, 2013, which is incorporated by reference herein in its entirety. The cooling liquid then flows to a return line in the cooling manifold 34 and the warmed cooling liquid is returned to the CDU 40. The CDU 40 removes the heat from the cooling liquid via the heat exchanger 44, which is cooled with facility supplied cooling water, and then pumps the cooled cooling liquid back to the compute racks 14.

Preferably, each computing board 52 may be configured as a separate computing node, so that the computing blade 32 includes two computing nodes that are logically independent, but that are physically joined together and share various hardware components, in order to share a single slot in the blade enclosure 16. In this way, the loss of one computing board 52 does not render the entire computing blade 32 inoperable. In addition, the compute blade 32 may include two side rails configured to hold the computing board 52 within the blade. This twin node configuration effectively doubles the achievable compute density over the existing single node blade configurations. Further details of the twin blade configuration can be found in the application Ser. No. 13/931,748 entitled TWIN SERVER BLADE FOR HIGH-DENSITY CLUSTERED COMPUTER SYSTEM, which is incorporated by reference herein in its entirety.

The coolant path from the CDU 40 to the compute rack 14 is a closed-loop system, which helps minimize the amount of liquid lost if a leak occurs in the fluid connections 36, 38. For example, the closed-loop system may hold approximately 55 gallons of distilled water with a water treatment solution, e.g., approximately one liter. Suitable water treatment solutions that may be used include sodium hydroxide solutions, such as those commercial available from Chemtreat, Inc. of Richmond, Va.

The CDU 40 is an interface between the building chilled water system and the cooling manifolds 34 within the M-rack compute rack 14 and is designed to circulate and control the chilled water to the cooling manifolds 34. To this end, the CDU 40 may monitor room conditions and prevent coil condensation by maintaining the chilled water being pumped to the cooling manifolds 34 at a temperature above the room's dew point. All functions within the CDU 40 may be automated, such as switching pumps (if applicable), controlling water temperature, etc. In embodiments of the cooling system, the cooling towers 12 are connected by fluid connections 24 to the building supply and return water piping, and the CDU 40 is connected by fluid connections 48 to the building supply and return piping, and also connected to the M-rack cooling manifolds 34 by fluid connections 38.

Depending on the configuration, the on-blade cold sink cooling may directly absorb approximately 50-65 percent of the heat dissipated by an individual dual-socket node blade in an HPC system. The remainder of the heat may then be air-cooled by the closed-loop air flow present in the cooling cell 10 configuration. Embodiments of the cooling system with the cooling cell 10 and the M-rack configuration with cold sink cooling may be able to support up to a maximum of 1000 W compute blades.

Although the above discussion discloses various exemplary embodiments of the invention, it should be apparent that those skilled in the art can make various modifications that will achieve some of the advantages of the invention without departing from the true scope of the invention.

What is claimed is:

1. A cooling system for a high performance computing system having a plurality of computing blades for use within a data center, the cooling system comprising:
    a sealed closed-loop airflow cooling cell including:
    a first compute rack including at least one blade enclosure, the first compute rack having a front, a back, and a side;
    a second compute rack including at least one blade enclosure, the second compute rack having a front, a back, and a side;
    a cooling tower coupled to the side of the first compute rack using an airtight seal and coupled to the side of the second compute rack using an airtight seal, the cooling tower having at least two water-cooled heat exchangers positioned in a v-shape with the open side of the v-shape facing one or more blowers; and
    the one or more blowers configured to draw warm air from the first and second compute racks across the water-cooled heat exchanger, and to circulate cooled air into the first and second compute racks; and
    a housing enclosing the first compute rack, the second compute rack, and the cooling tower to provide a closed-loop air flow within the cooling cell;
    wherein the cooling cell is within the data center and substantially no air from the cooling cell enters the data center.

2. The cooling system of claim 1, wherein at least one of the compute racks in one of the closed-loop cooling cells further includes a cooling manifold in the blade enclosure that is configured to couple to the plurality of computing blades in the blade enclosure, the cooling system further comprising an external cooling distribution unit having fluid connections in fluid communication with the cooling manifolds.

3. The cooling system of claim 2, wherein the external cooling distribution unit further includes
    a liquid-cooled heat exchanger in contact with a portion of the fluid connections; and
    one or more pumps configured to move liquid within the fluid connections from the cooling manifolds to the liquid-cooled heat exchanger.

4. The cooling system of claim 1, wherein at least one of the compute racks in the closed-loop cooling cell further includes a cooling manifold in the blade enclosure that is configured to couple to the plurality of computing blades in the blade enclosure, the cooling system further comprising an external cooling distribution unit having fluid connections in fluid communication with the cooling manifolds.

5. The cooling system of claim 4, wherein the external cooling distribution unit further includes
    a liquid-cooled heat exchanger in contact with a portion of the fluid connections; and
    one or more pumps configured to move liquid within the fluid connections from the cooling manifolds to the liquid-cooled heat exchanger.

6. The cooling system of claim 1, wherein the cooling cell includes two water-cooled heat exchangers positioned in a v-shape.

7. The cooling system of claim 1, wherein the first and second racks are in an M-rack configuration.

8. The cooling system of claim 1, wherein the first and second racks are in a D-rack configuration.

9. A high performance computing (HPC) system for use within a data center comprising: a sealed closed-loop airflow cooling cell including:
    a first compute rack including at least one blade enclosure, the first compute rack having a front, a back, and a side;
    a second compute rack including at least one blade enclosure, the second compute rack having a front, a back, and a side;
    a cooling tower coupled to the side of the first compute rack using an airtight seal and coupled to the side of the second compute rack using an airtight seal, the cooling tower having at least two water-cooled heat exchangers positioned in a v-shape with the open side of the v-shape facing one or more blowers; and the one or more blowers configured to draw warm air from the first and second compute racks across the water-cooled heat exchanger, and to circulate cooled air into the first and second compute racks; and
    a housing enclosing the first compute rack, the second compute rack, and the cooling tower to provide a closed-loop air flow within the cooling cell; and a plurality of computing blades in each blade enclosure;
    wherein the cooling cell is located within the data center and substantially no air from the cooling cell enters the data center.

10. The HPC system of claim 9, wherein at least one of the compute racks in one of the closed-loop cooling cells further includes a cooling manifold in the blade enclosure that is coupled to the plurality of computing blades in the blade enclosures, the HPC system further comprising an external cooling distribution unit having fluid connections in fluid communication with the cooling manifolds.

11. The HPC system of claim 10, wherein the external cooling distribution unit further includes
    a liquid-cooled heat exchanger in contact with a portion of the fluid connections; and
    one or more pumps configured to move liquid within the fluid connections from the cooling manifolds to the liquid-cooled heat exchanger.

12. The HPC system of claim 9, wherein at least one of the compute racks in the closed-loop cooling cell further includes a cooling manifold in the blade enclosure that is coupled to the plurality of computing blades in the blade enclosure, the HPC system further comprising an external cooling distribution unit having fluid connections in fluid communication with the cooling manifolds.

13. The HPC system of claim 12, wherein the external cooling distribution unit further includes
   a liquid-cooled heat exchanger in contact with a portion of the fluid connections; and
   one or more pumps configured to move liquid within the fluid connections from the cooling manifolds to the liquid-cooled heat exchanger.

14. The HPC system of claim 9, wherein the cooling cell includes two water-cooled heat exchangers positioned in a v-shape.

15. The HPC system of claim 9, wherein the first and second racks are in an M-rack configuration.

16. The HPC system of claim 9, wherein the first and second racks are in a D-rack configuration.

17. The system according to claim 1 further comprising:
   one or more cooling plates, each cooling plate configured to be disposed between two computing boards within the computing blade; and
   a fluid connection coupled to the cooling plate and in fluid communication with the blade enclosure.

18. The HPC system according to claim 9 further comprising:
   one or more cooling plates, each cooling plate configured to be disposed between two computing boards within the computing blade; and
   a fluid connection coupled to the cooling plate and in fluid communication with the blade enclosure.

* * * * *